United States Patent
Liu et al.

(10) Patent No.: US 12,451,417 B2
(45) Date of Patent: Oct. 21, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tzuan-Horng Liu, Taoyuan (TW); Hao-Yi Tsai, Hsinchu (TW); Kuo-Lung Pan, Hsinchu (TW); Tsung-Yuan Yu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 604 days.

(21) Appl. No.: 17/880,689

(22) Filed: Aug. 4, 2022

(65) Prior Publication Data

US 2024/0047332 A1    Feb. 8, 2024

(51) Int. Cl.
*H01L 23/498* (2006.01)
*H01L 21/48* (2006.01)
(Continued)

(52) U.S. Cl.
CPC ...... *H01L 23/49833* (2013.01); *H01L 23/481* (2013.01); *H01L 23/49816* (2013.01);
(Continued)

(58) Field of Classification Search
CPC . H01L 23/481; H01L 24/92; H01L 23/49816; H01L 23/49833; H01L 25/50;
(Continued)

(56) References Cited

U.S. PATENT DOCUMENTS

| 9,000,584 B2 | 4/2015 | Lin et al. |
| 9,048,222 B2 | 6/2015 | Hung et al. |
| (Continued) | | |

FOREIGN PATENT DOCUMENTS

| TW | 201826466 | 7/2018 |
| TW | 202018902 | 5/2020 |
| TW | 202230540 | 8/2022 |

OTHER PUBLICATIONS

"Office Action of Taiwan Counterpart Application", issued on Sep. 22, 2023, pp. 1-15.

*Primary Examiner* — Mouloucoulaye Inoussa
(74) *Attorney, Agent, or Firm* — JCIPRNET

(57) ABSTRACT

A semiconductor package includes a first tier and a second tier underlying the first tier and including TIVs and third dies. The first tier includes a first redistribution structure and first and second dies disposed side-by-side and separated by a first insulating encapsulation. A surface of the first insulating encapsulation, surfaces of first die connectors of the first die, and truncated spherical surfaces of second die connectors of the second die are level. The first redistribution structure underlies the surfaces of the first insulating encapsulation and the first die connectors and the truncated spherical surfaces of the second die connectors. The third dies disposed below the first redistribution structure are electrically coupled to the first die through the first redistribution structure and laterally covered by a second insulating encapsulation. The TIVs penetrate through the second insulating encapsulation and are electrically coupled to the second die through the first redistribution structure.

20 Claims, 39 Drawing Sheets

(51) Int. Cl.
  *H01L 23/00* (2006.01)
  *H01L 23/48* (2006.01)
  *H01L 25/16* (2023.01)

(52) U.S. Cl.
  CPC ........ *H01L 23/49838* (2013.01); *H01L 24/08* (2013.01); *H01L 24/16* (2013.01); *H01L 24/32* (2013.01); *H01L 24/73* (2013.01); *H01L 25/162* (2013.01); H01L 21/4853 (2013.01); H01L 2224/08235 (2013.01); H01L 2224/16227 (2013.01); H01L 2224/16235 (2013.01); H01L 2224/16238 (2013.01); H01L 2224/32225 (2013.01); H01L 2224/73204 (2013.01); H01L 2224/73251 (2013.01); H01L 2924/1431 (2013.01); H01L 2924/1434 (2013.01); H01L 2924/37001 (2013.01)

(58) Field of Classification Search
  CPC ............. H01L 23/49838; H01L 25/162; H01L 25/0652; H01L 24/08; H01L 24/19; H01L 24/32; H01L 23/5389; H01L 24/20; H01L 24/73; H01L 24/16; H01L 25/105; H01L 24/09; H01L 23/5221; H01L 23/5226; H01L 23/53238; H01L 25/0657; H01L 24/97; H01L 24/81; H01L 24/17; H01L 23/5383; H01L 25/0655; H01L 23/5385; H01L 21/486; H01L 21/568; H01L 21/56; H01L 23/5386; H01L 21/4853; H01L 21/4857; H01L 23/5384; H01L 23/3135; H01L 23/367; H01L 23/3128; H01L 24/13; H01L 2224/16238; H01L 2924/1431; H01L 2225/06548; H01L 2225/06524; H01L 2225/06541; H01L 2224/16235; H01L 2224/32225; H01L 2224/73251; H01L 2225/06586; H01L 2225/06527; H01L 2924/37001; H01L 2224/73204; H01L 2224/0603; H01L 2224/81204; H01L 2224/0557; H01L 2224/81447; H01L 2924/1533; H01L 2225/1023; H01L 2224/92125; H01L 2224/1703; H01L 2224/16227; H01L 2224/06181; H01L 2224/81815; H01L 2924/19011; H01L 2924/15311; H01L 2225/06517; H01L 2225/06589; H01L 2225/1058; H01L 2224/2929; H01L 2224/05599; H03K 19/17708; H03K 19/1776; H03K 19/17744; H03K 19/17728

See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 11,394,386 | B2* | 7/2022 | Lin ..................... H01L 23/5384 |
| 2011/0068468 | A1* | 3/2011 | Lin ..................... H01L 25/0652 257/737 |
| 2016/0240508 | A1* | 8/2016 | Hou .................... H01L 23/3121 |
| 2017/0338200 | A1* | 11/2017 | Huang .................... H01L 24/19 |
| 2018/0277485 | A1* | 9/2018 | Han .................. H01L 21/486 |
| 2019/0006315 | A1* | 1/2019 | Hsu ................... H01L 21/6835 |
| 2019/0057931 | A1* | 2/2019 | Hsu ................... H01L 21/6835 |
| 2019/0131273 | A1* | 5/2019 | Chen ...................... H01L 24/19 |
| 2019/0238134 | A1* | 8/2019 | Lee .................... H01L 23/5389 |
| 2020/0066642 | A1* | 2/2020 | Yu ....................... H01L 21/4857 |
| 2020/0083172 | A1* | 3/2020 | Hsieh .................. H01L 23/3121 |
| 2020/0266167 | A1* | 8/2020 | Lee .................... H01L 25/0652 |
| 2020/0395281 | A1* | 12/2020 | Chien ............... H01L 23/49822 |
| 2021/0057352 | A1* | 2/2021 | Agarwal ............. H01L 21/4857 |
| 2021/0080500 | A1* | 3/2021 | Braunisch .......... H01L 23/5384 |
| 2021/0143124 | A1* | 5/2021 | Lin ................... H03K 19/17708 |
| 2021/0272930 | A1* | 9/2021 | Choi .................. H01L 23/5384 |
| 2021/0351775 | A1* | 11/2021 | Lee .......................... G06F 30/34 |
| 2022/0077132 | A1* | 3/2022 | Chen .................. H01L 23/3135 |
| 2022/0223534 | A1 | 7/2022 | Lin et al. |
| 2022/0415810 | A1* | 12/2022 | Hsieh .................. H01L 23/5389 |

* cited by examiner

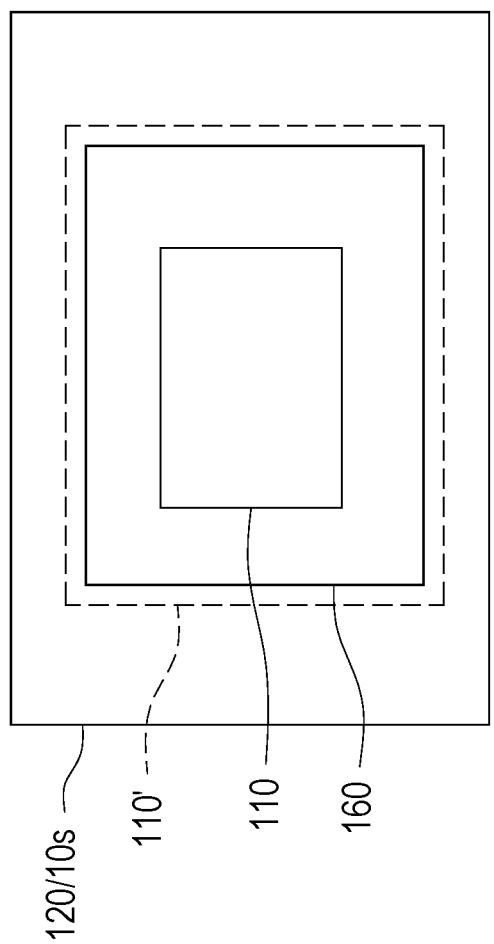

SEMICONDUCTOR PACKAGE AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFP), pin grid array (PGA) packages, ball grid array (BGA) packages, flip chips (FC), three-dimensional integrated circuits (3DICs), wafer level packages (WLPs), package-on-package (PoP) structures, and integrated fan-out (InFO) packages, etc. Although existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F is a schematic top view illustrating a configuration of various dies and electrical devices in the semiconductor package of FIG. 2E, in accordance with some embodiments.

DETAILED DESCRIPTION

Figure 1A:
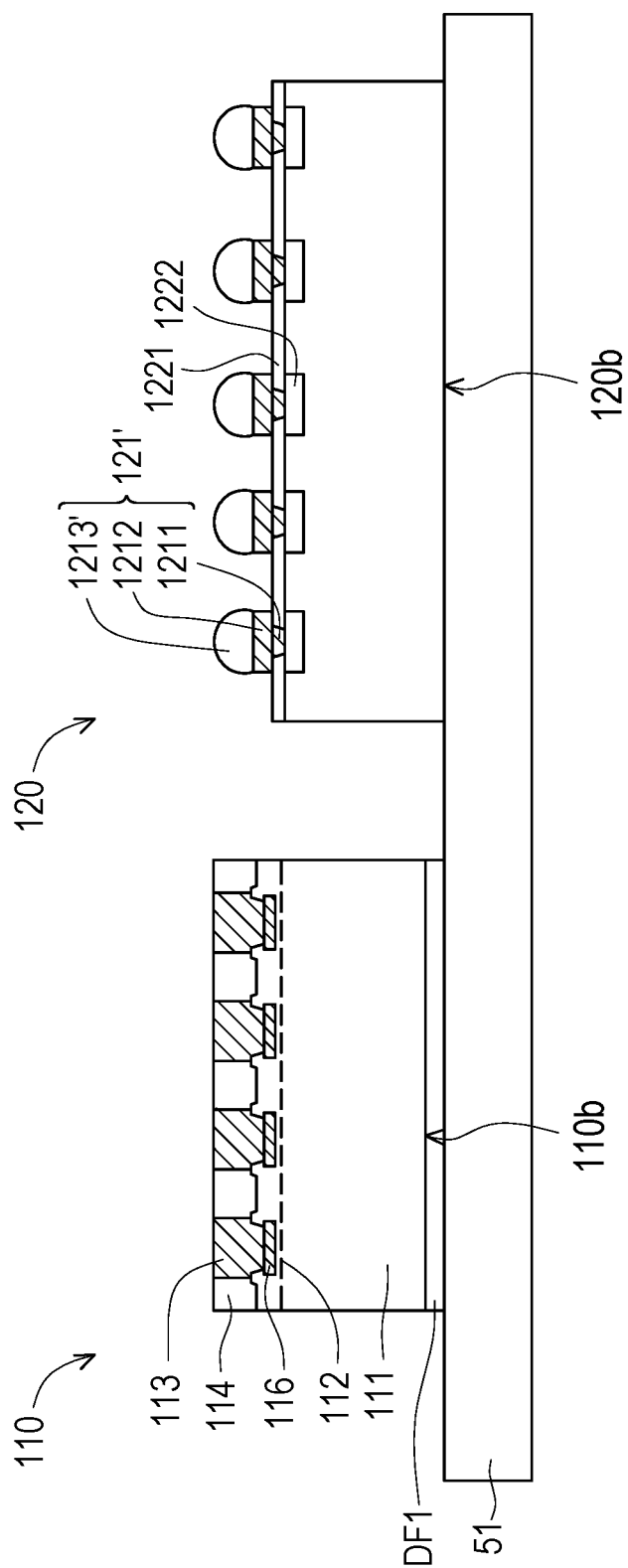
FIGS. 1A-1F are schematic cross-sectional views illustrating various stages of a manufacturing method of a semiconductor package having a back-to-face configuration, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
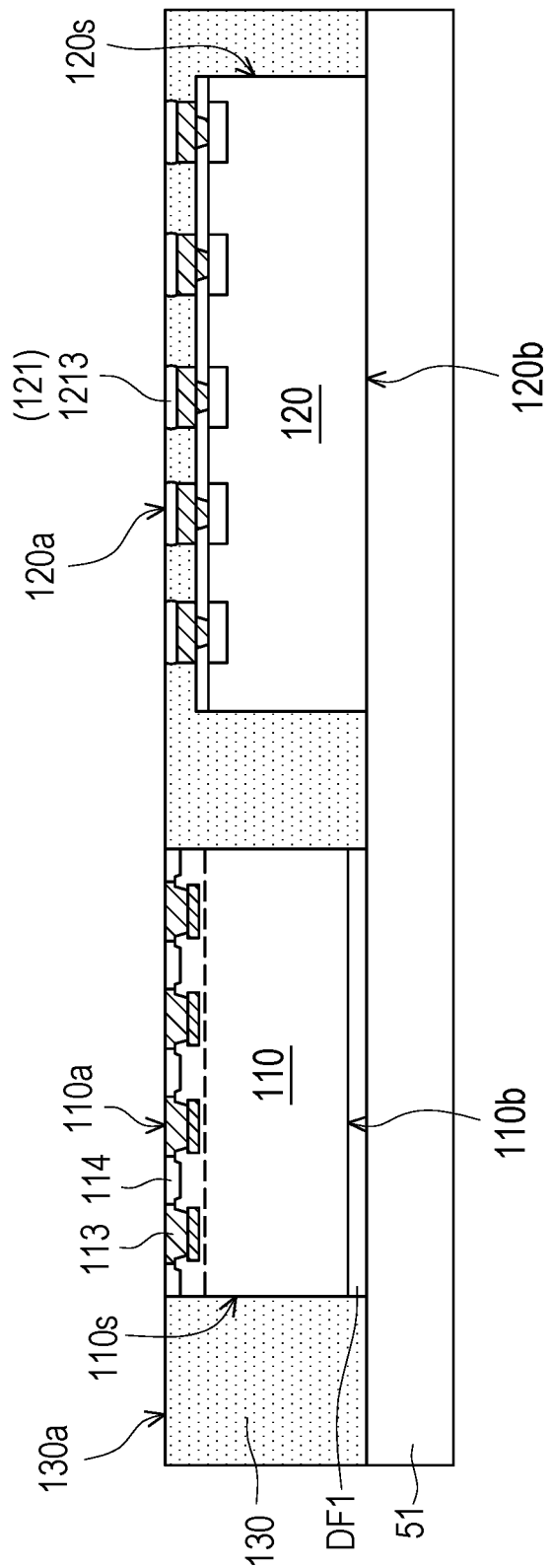
Figure 1C:
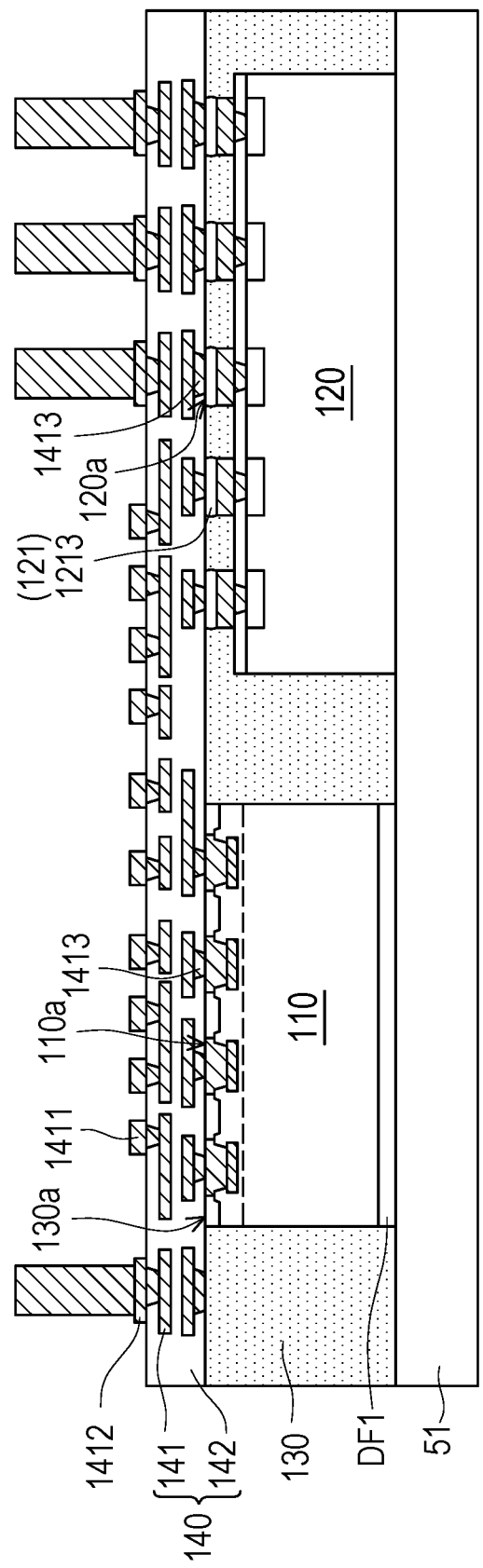
Figure 1D:
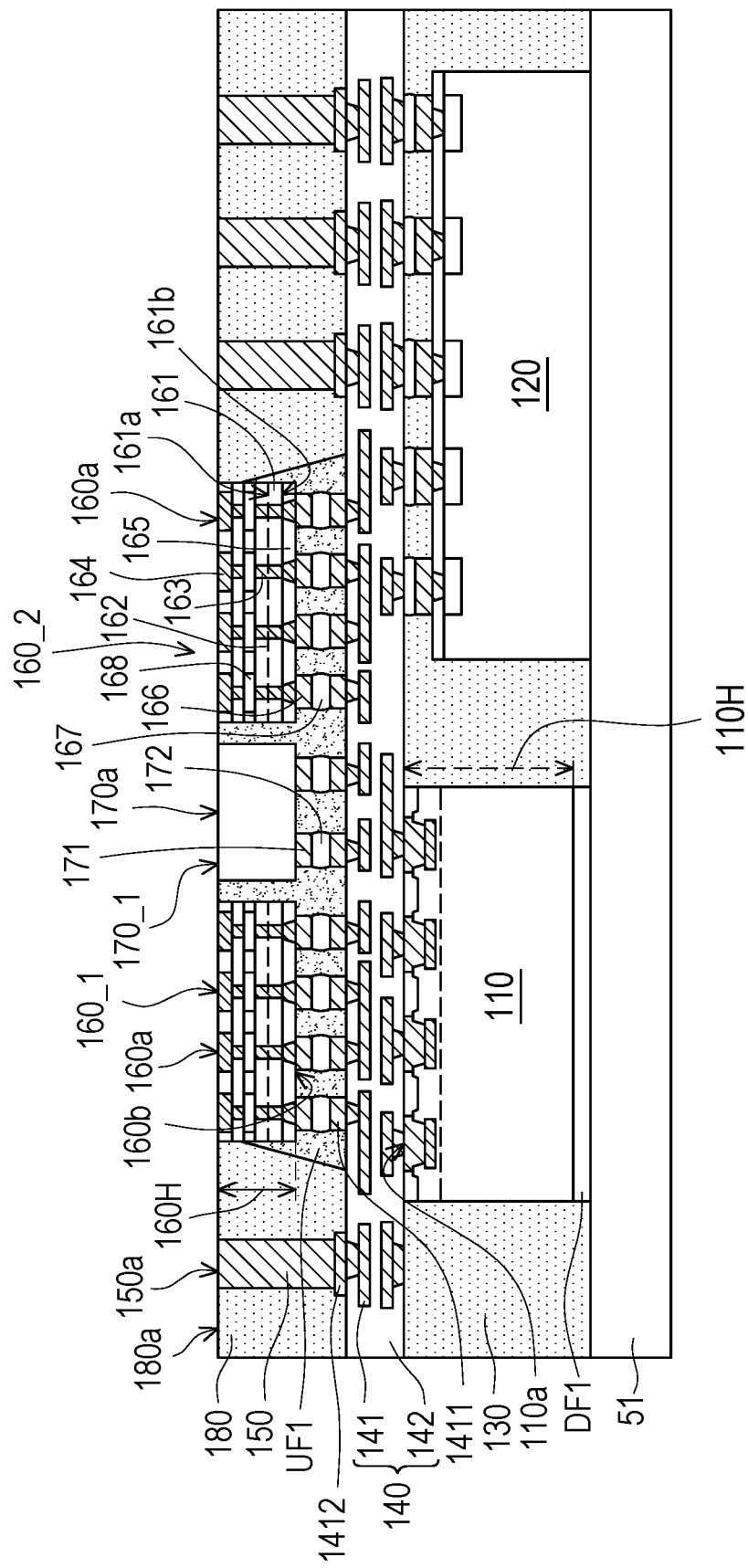
Figure 1E:
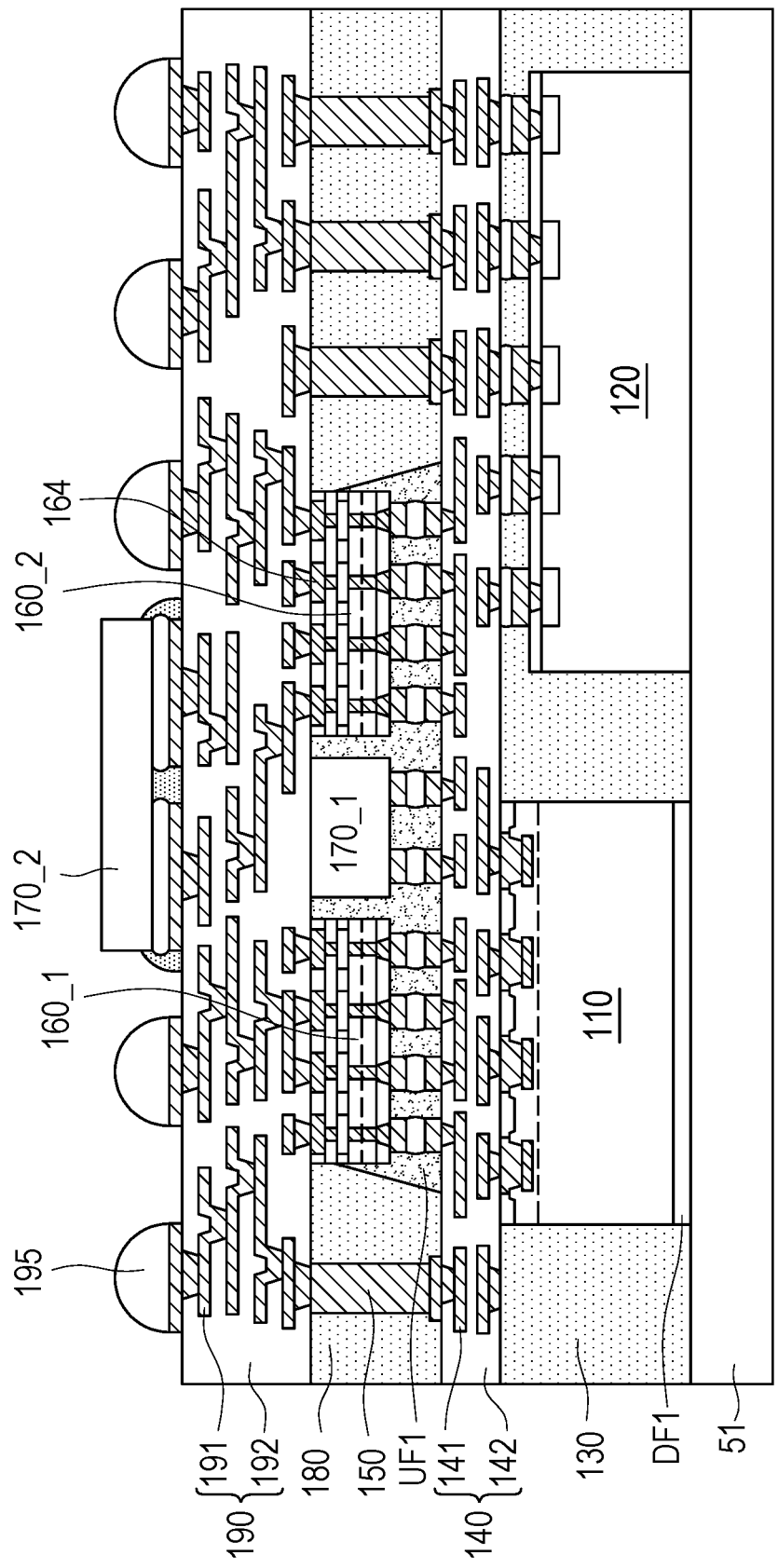
Figure 1F:
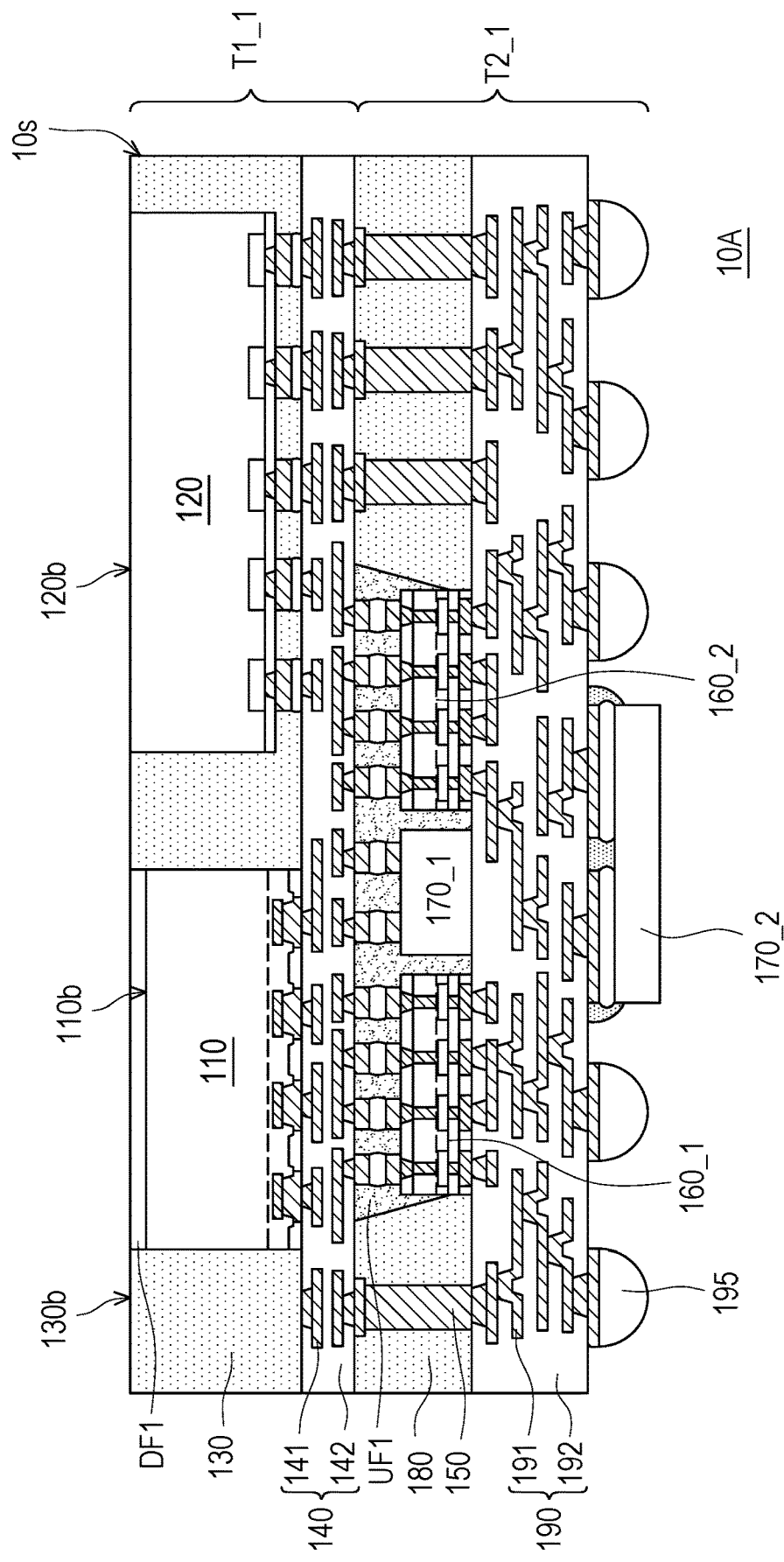
Figure 1G:
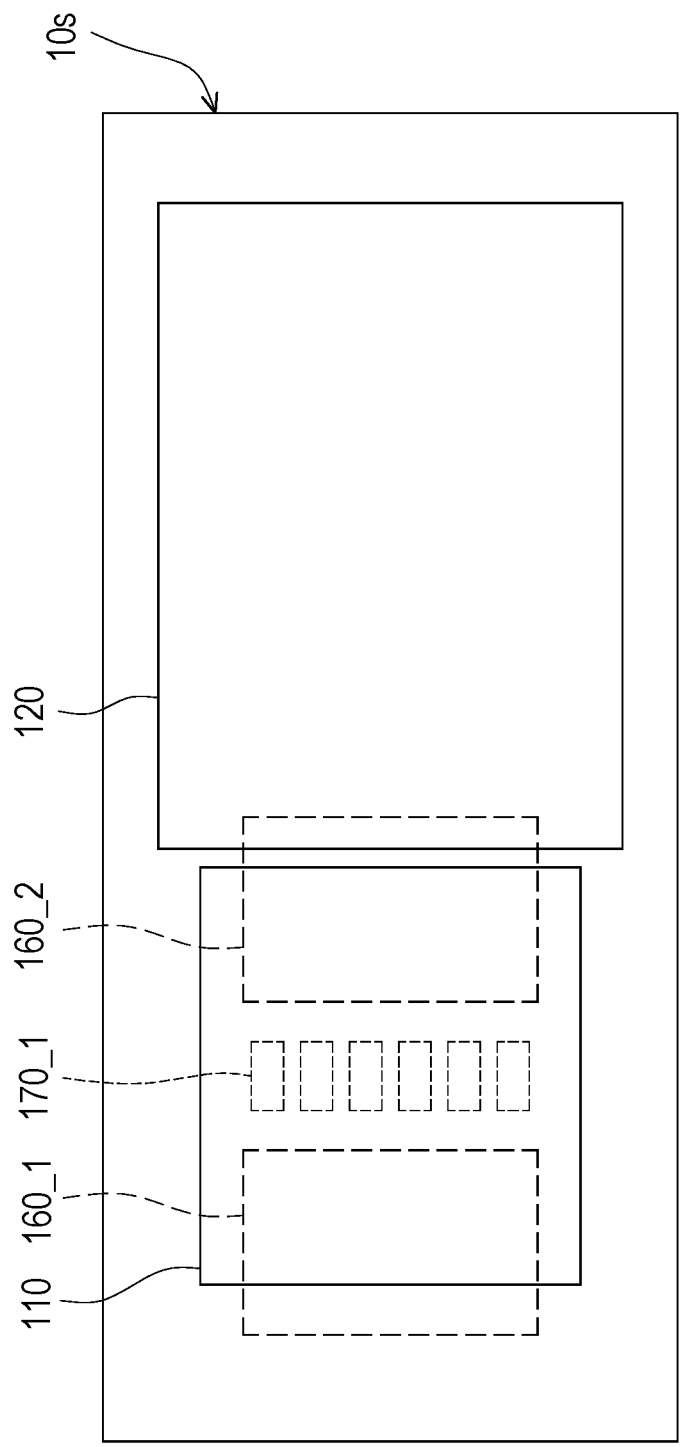
FIG. 1G is a schematic top view illustrating a configuration of various dies and electrical devices in the semiconductor package of FIG. 1F, in accordance with some embodiments.

FIGS. 1A-1F are schematic cross-sectional views illustrating various stages of a manufacturing method of a semiconductor package having a back-to-face configuration, and FIG. 1G is a schematic top view illustrating a configuration of various dies and electrical devices in the semiconductor package of FIG. 1F, in accordance with some embodiments.

Referring to FIG. 1A, a first die 110 and a second die 120 may be disposed side by side on a temporary carrier 51. The temporary carrier 51 may be made of a material such as silicon, polymer, polymer composite, metal foil, ceramic, glass, glass epoxy, tape, or other suitable material for structural support. In some embodiments, an adhesive layer (not shown) is formed on the temporary carrier 51 before the placement of the first die 110 and the second die 120. The adhesive layer may be detached from the temporary carrier 51 by, e.g., shining an ultra-violet (UV) light on the temporary carrier 51 in a subsequent carrier de-bonding process. For example, the adhesive layer is a light-to-heat-conversion (LTHC) coating layer or the like. In some embodiments, a back surface 110*b* of the first die 110 and/or a back surface 120*b* of the second die 120 may be attached to the temporary carrier 51 through a connecting film DF1 (e.g., die attach films or the like). In some embodiments, the connecting film DF1 includes a dielectric material having high thermal conductivity. Alternatively, the connecting film(s) DF1 may be omitted.

In some embodiments, the first die 110 and the second die 120 are of different types of semiconductor dies. The first die 110 and/or the second die 120 may be or include a logic die (e.g., a central processing unit (CPU), a graphics processing unit (GPU), a system-on-a-chip (SoC), an application processor (AP), and a microcontroller); a power management die; a wireless and radio frequency (RF) die; a baseband (BB) die; a sensor die; a micro-electro-mechanical-system (MEMS) die; a signal processing die; a front-end die (e.g., an analog front-end (AFE) die); an application-specific integrated circuit (ASIC) die; a combination thereof; or the like. In alternative embodiments, the first die 110 and/or the second die 120 may be or include a memory die (e.g., a dynamic random-access memory (DRAM) die, a static random-access memory (SRAM) die, a resistive random-access memory (RRAM), a magneto-resistive random-access memory (MRAM), a NAND flash memory, a hybrid memory cube (HMC) module, a high bandwidth memory (HBM) module); a combination thereof; or the like. In alternative embodiments, the first die 110 and/or the second die 120 may be or include an artificial intelligence (AI) engine; a computing system (e.g., an AI server, a high-performance computing (HPC) system, a high-power computing device, a cloud computing system, a networking system, an edge computing system, a SoIC system, etc.); a combination thereof; or the like.

The first die 110 and/or the second die 120 may be cut from a semiconductor wafer (not shown). In some embodiments, the first die 110 includes a first semiconductor substrate 111, a first device layer 112 formed in/on the first semiconductor substrate 111, first die connectors 113 formed over the first device layer 112, and a first protection layer 114 formed over the first device layer 112 and covering the first die connectors 113. The first semiconductor substrate 111 may include an elementary semiconductor (e.g., silicon or germanium in a crystalline, a polycrystalline, or an amorphous structure, etc.), a compound semiconductor (e.g., SiC, GaAs, GaP, InP, InAs, and/or InSb, etc.), an alloy semiconductor (e.g., SiGe, GaAsP, AlInAs, AlGaAs, GaInAs, GaInP, etc.), combinations thereof, or other suitable materials. In some embodiments, the first semiconductor substrate 111 may be a compound semiconductor substrate having a multilayer structure or any suitable substrate. In some embodiments, semiconductor devices are formed in the first device layer 112, and may include active devices (e.g., transistors, diodes, etc.) and/or passive devices (e.g., capacitors, resistors, inductors, etc.), or other suitable electrical devices.

In some embodiments, an interconnect structure 116 including interconnect conductive layers and interconnect dielectric layers are formed between the first device layer 112 and the first die connectors 113 to be electrically coupled to the semiconductor devices in the first device layer 112 and the first die connectors 113. The first die connectors 113 may include a conductive material such as solder, copper, aluminum, gold, nickel, silver, palladium, tin, the like, or a combination thereof. In some embodiments, the first die connectors 113 include metal pillars (e.g., a copper pillar) formed by a sputtering, printing, plating, CVD, or the like, with or without a solder cap thereon. The first and second die connectors 113 and 121 may be of different materials. In some embodiments, the protection layer 114 is formed of a polymer, such as polyimide, polybenzoxazole (PBO), benzocyclobutene (BCB), and/or other suitable dielectric material(s). At this stage, the first die connectors 113 may be buried in the protection layer 114.

In some embodiments, the second die 120 may include one or more semiconductor devices, semiconductor dies, bonding wires, conductive pads, an insulating encapsulation, etc., depending on design requirements. For example, the second die 120 includes second die connectors 121'. Examples of the second die connectors 121' may include solder balls, micro-bumps, metal pillars, electroless nickel-electroless palladium-immersion gold (ENEPIG) formed bumps, controlled collapse chip connection (C4) bumps, ball grid array (BGA) bumps, or the like. In some embodiments, the respective second die connector 121' includes a via portion 1211, a pillar portion 1212 overlying the via portion 1211, and a cap portion 1213' overlying the pillar portion 1212, where the via and pillar portions 1211 and 1212 are of the same material (e.g., copper), and the pillar and cap portions 1212 and 1213' are of different materials. The pillar portion 1212 may be formed on the top surface of the passivation layer 1221, and the via portion 1211 may penetrate through the passivation layer 1221 to be in physical and electrical contact with the corresponding contact pad 1222. The cap portion 1213' may include solder material and may be a rounded ball with a truncated end landing on the pillar portion 1212 (e.g., copper pillar).

Referring to FIG. 1B and with reference to FIG. 1A, a first insulating encapsulation 130 may be formed over the temporary carrier 51 to laterally cover the first and second dies 110 and 120 and the connecting film DF1. For example, the first insulating encapsulation 130 extends along the sidewalls 110*s* and 120*s* of the first and second dies 110 and 120. The first insulating encapsulation 130 may extend to surround the spacing between adjacent second die connectors 121. In some embodiments, the first insulating encapsulation 130 is a molding compound formed by a molding process. For example, the first insulating encapsulation 130 includes polymers (e.g., epoxy resins, phenolic resins, silicon-containing resins, or other suitable resins), dielectric materials, or other suitable materials. In some embodiments, the first insulating encapsulation 130 is made of a molding underfill material. In some embodiments, the first insulating encapsulation 130 includes inorganic fillers which can be added to optimize coefficient of thermal expansion (CTE) of the first insulating encapsulation 130. The disclosure is not limited thereto.

In some embodiments, a layer of insulating encapsulation material is formed over the temporary carrier 51 to encapsulate the first and second dies 110 and 120, and then a planarization process (e.g., chemical mechanical polishing (CMP), mechanical grinding, etching, a combination thereof, etc.) is performed on the insulating encapsulation material until the first die connectors 113 and the second die connectors 121 are accessibly exposed. In some embodiments, during the planarization process, an upper portion of the protection layer 114 of the first die 110 that covers the top surfaces of the first die connectors 113 is removed. In some embodiments, during the planarization process, the top of the cap portion 1213' of the respective second die connector 121' is partially removed to impart a truncated spherical shape to the cap portion 1213 of the respective second die connector 121. As shown in FIG. 1B, the respective second die connector 121 may be a rounded ball with two truncated ends. For example, the top surface 130a of the first insulating encapsulation 130 is substantially leveled (or coplanar) with the active surface 110a of the first die 110 and the active surface 120a of the second die 120, where the active surface 110a includes the exposed surfaces of the first die connectors 113, and the active surface 120 includes the exposed surfaces of the second die connectors 121.

Referring to FIG. 1C and with reference to FIG. 1B, a first redistribution structure 140 may be formed on the active surface 110a of the first die 110, the active surface 120a of the second die 120, and the top surface 130a of the first insulating encapsulation 130. The first redistribution structure 140 may include one or more first patterned conductive layer(s) 141 formed in one or more first dielectric layer(s) 142. In some embodiments, the first dielectric layer 142 includes a polymer, such as PBO, polyimide, BCB, or the like; a nitride such as silicon nitride; an oxide such as silicon oxide, phosphosilicate glass (PSG), borosilicate glass (BSG), boron-doped phosphosilicate glass (BPSG), and/or the like. In some embodiments, the first patterned conductive layer 141 includes conductive lines, conductive vias, and conductive pads, etc., and may be formed of any suitable conductive material(s) such as copper, titanium, tungsten, aluminum, alloys, or the like.

In some embodiments, the bottommost sublayer of the first dielectric layer 142 is formed and patterned over the first and second dies 110 and 120 and the first insulating encapsulation 130 by using lithography and etching or other suitable processes, and then the bottommost sublayer 1413 of the first patterned conductive layer 141 is formed on the top surface of the bottommost sublayer of the first dielectric layer 142 and in openings of the bottommost sublayer of the first dielectric layer 142 to be physically and electrically coupled to the first and second die connectors 114 and 121. For example, the conductive vias in the bottommost sublayer 1413 of the first patterned conductive layer 141 are tapered toward the corresponding first and second die connectors 114 and 121, where the conductive vias may directly land on the upper truncated end of the cap portion 1213.

The topmost sublayer of the first patterned conductive layer 141 may include first conductive pads 1411 and second conductive pads 1412 surrounding the first conductive pads 1411, where the first and second conductive pads 1411 and 1412 are accessibly exposed from the topmost sublayer of the first dielectric layer 142 for further electrical connection. The first conductive pads 1411 may be distributed right over the first die 110 and/or the second die 120. The pitch of the adjacent first conductive pads 1411 may be less than that of the adjacent second conductive pads 1412. The density per unit area of the first conductive pads 1411 may be denser than that of the second conductive pads 1412.

In some embodiments, the steps of forming a sublayer of the first dielectric layer 142 and forming a sublayer of the first patterned conductive layer 141 are repeated to form a multi-layered redistribution structure. It is noted that the number of sublayers of the first dielectric layer 142 and the first patterned conductive layer 141 in the first redistribution structure 140 may construe no limitation in the disclosure. Other methods of forming the first redistribution structure 140 are possible and fully intended to be included within the scope of the disclosure.

With continued reference to FIG. 1C, conductive pillars 150 may be formed on the second conductive pads 1412 of the first patterned conductive layer 141 of the first redistribution structure 140. The conductive pillars 150 may be formed by: forming a seed layer; forming a patterned photoresist over the seed layer, where each of the openings in the patterned photoresist corresponds to a location of the respective conductive pillar 150 to be formed; filling the openings with an electrically conductive material such as copper using, e.g., plating or the like; removing the patterned photoresist using, e.g., an ashing or a stripping process; and removing portions of the seed layer on which the conductive pillars 150 are not formed. Other methods for forming the conductive pillars 150 are possible and fully intended to be included within the scope of the disclosure.

Referring to FIG. 1D, at least one third dies (e.g., 160_1 and 160_2) may be mounted on the first conductive pads 1411 of the first patterned conductive layer 141 of the first redistribution structure 140. In some embodiments, the third dies (160_1 and 160_2) are of different sizes. For example, the lateral dimension of the third die 160_1 disposed right over the first die 110 is less than the lateral dimension of the third die 160_2 disposed over the first die 110, the second die 120, and a portion of the first insulating encapsulation 130 therebetween. Alternatively, the third dies (160_1 and 160_2) are of the same size. In some embodiments, the thickness of the third dies (160_1 and 160_2) is less than the thickness of the first die 110 and/or the second die 120. By way of example and not limitation, the thickness 110H of the first die 110 is about 660 µm, while the thickness 160H of the third dies (160_1 and/or 160_2) is about 30 µm. Although other value(s) are fully intended to be included within the scope of the disclosure.

The respective third die (160_1 and/or 160_2) may include a third semiconductor substrate 161 having a front surface 161a and a back surface 161b opposite to each other, a third device layer 162 formed in/on the front surface 161a of the third semiconductor substrate 161, through substrate vias (TSVs) 163 penetrating through the third semiconductor substrate 161 and electrically coupled to the third device layer 162, front-side connectors 164 disposed over and electrically coupled to the third device layer 162, an isolation layer 165 disposed on the back surface 161b of the third semiconductor substrate 161 and laterally covering the TSVs 163, and third die connectors 166 underlying the isolation layer 165 and coupled to the TSVs 163. The material of the third semiconductor substrate 161 may be similar to that of the first semiconductor substrate 111. Semiconductor devices (e.g., transistors, diodes, capacitors, resistors, inductors, etc.) may be included in the third device layer 162. The conductive vias 163, the front-side connectors 164, and the third die connectors 166 may include one or more conductive materials (e.g., cobalt, titanium, tungsten, copper, aluminum, tantalum, titanium nitride, tantalum nitride, gold, silver, another metal, a metal alloy, or combinations thereof). The isolation layer 165 may be made of polyimide or other suitable insulating material(s).

In some embodiments, the respective third die (160_1 and/or 160_2) may include an interconnect structure 168 including interconnect conductive layers and interconnect dielectric layers interposed between the third device layer 162 and the front-side connectors 164, where the interconnect conductive layers are electrically coupled to the third device layer 162, the front-side connectors 164, and the TSVs 163. Conductive joints 167, such as solder joints, may be formed between the third die connectors 166 and the underlying first conductive pads 1411 for coupling the third dies (160_1 and 160_2) to the first redistribution structure 140.

With continued reference to FIG. 1D, at least one first electrical device 170_1, such as an integrated passive device (IPD), may be mounted on the first conductive pads 1411 of the first redistribution structure 140. Conductive joints 172, such as solder joints, may be formed between device connectors 171 of the first electrical device 170_1 and the underlying first conductive pads 1411. The first electrical device 170_1 may be electrically coupled to the first die 110 through the first patterned conductive layer 141 of the first redistribution structure 140. In some embodiments, the first electrical device 170_1 is disposed right over the first die 110 and laterally interposed between the third dies (160_1 and 160_2). In some embodiments, an underfill layer UF1 is formed in gaps between the third dies 160_1 and 160_2 and the underlying first conductive pads 1411 and also between the first electrical device 170_1 and the underlying first conductive pads 1411 to surround the conductive joints 167 and 172 for protection. The underfill layer UF1 may also be formed in a gap among the first electrical device 170_1 and the third dies (160_1 and 160_2). The underfill layer UF1 may partially (or fully) cover the sidewalls of the third dies (160_1 and 160_2) and/or the sidewall of the first electrical device 170_1. Alternatively, the underfill layer UF1 is omitted.

Still referring to FIG. 1D, a second insulating encapsulation 180 may be formed on the first redistribution structure 140 to laterally cover the conductive pillars 150, the third dies (160_1 and 160_2), the first electrical device 170_1, and the underfill layer UF1. The material and the forming method of the second insulating encapsulation 180 may be similar to the first insulating encapsulation 130. In some embodiments, the thickness of the second insulating encapsulation 180 is less than that of the first insulating encapsulation 130. In embodiments where the underfill layer UF1 is omitted, the second insulating encapsulation 180, e.g., molding underfill, is formed in the gaps among the third dies (160_1 and 160_2), the first electrical device 170_1, and the underlying first conductive pads 1411. In some embodiments, the first electrical device 170_1 is surrounded by the underfill layer UF1, and the second insulating encapsulation 180 is separated from the first electrical device 170_1 through the underfill layer UF1. In some embodiments, all of the sidewalls of the first electrical device 170_1 and the third dies (160_1 and 160_2) are covered by the underfill layer UF1, and the second insulating encapsulation 180 is separated from the first electrical device 170_1 and the third dies (160_1 and 160_2) by the underfill layer UF1.

The conductive pillars 150 that penetrate through the second insulating encapsulation 180 may be referred to as through insulation vias (TIVs) 150. In some embodiments, after the planarization process (e.g., CMP, mechanical grinding, etching, a combination thereof, etc.) is performed, the top surface 180a of the second insulating encapsulation 180 is substantially leveled (or coplanar) with the top surfaces 150a of the TIVs 150, the front surfaces 160a of the third dies (160_1 and 160_2), and a back surface 170a of the first electrical device 170_1, where the respective front surface 160a may include the exposed surfaces of the front-side connectors 164 for further electrical connection. In some embodiments, the active surface 110a of the first die 110 faces the back surfaces 160b of the third dies (160_1 and 160_2), and such configuration may be viewed as a back-to-face configuration.

Referring to FIG. 1E and with reference to FIG. 1D, a second redistribution structure 190 may be formed on the second insulating encapsulation 180, the TIVs 150, the third dies (160_1 and 160_2), and the first electrical device 170_1. The second redistribution structure 190 may include one or more second patterned conductive layer(s) 191 formed in one or more second dielectric layer(s) 192. The materials and the forming methods of the second patterned conductive layer 191 and the second dielectric layer 192 may be similar to those of the first patterned conductive layer 141 and the first dielectric layer 142, respectively. For example, the bottommost sublayer of the second patterned conductive layer 191 may be in physical and electrical contact with the top surfaces 150a of the TIVs 150 and the exposed surfaces of the front-side connectors 164 at the front surfaces 160a of the third dies (160_1 and 160_2). In some embodiments, the topmost sublayer of the second patterned conductive layer 191 may be or include under bump metallization (UBM) pads for further electrical connection.

In some embodiments, conductive terminals 195 are formed on the UBM pads of the topmost sublayer of the second patterned conductive layer 191. The conductive terminals 195 may include a conductive material such as solder, copper, aluminum, gold, nickel, silver, palladium, tin, the like, or a combination thereof. The conductive terminals 195 may be solder balls, metal pillars, a ball grid array (BGA), controlled collapse chip connection (C4) bumps, micro bumps, electroless nickel-electroless palladium-immersion gold (ENEPIG) technique formed bumps, combination thereof (e.g., a metal pillar having a solder ball attached thereof), or the like. In some embodiments, the conductive terminals 195 include an eutectic material and may include a solder bump, a solder ball, or the like. A reflow process may be performed, giving the conductive terminals 195 a shape of a partial sphere. Alternatively, the conductive terminals 195 may include non-spherical connectors or have other shape(s).

In some embodiments, at least one second electrical device 170_2 may be mounted on the UBM pads of the second patterned conductive layer 191 of the second redistribution structure 190 through conductive joints (not labeled). The second electrical device 170_2 may be surrounded by the conductive terminals 195. In some embodiments, the electrical device 170_2 is electrically coupled to the third dies (160_1 and/or 160_2) through the second patterned conductive layer 191 of the second redistribution structure 190. In some embodiments, the electrical device 170_2 is electrically coupled to the first die 110 through the second redistribution structure 190, the TIVs 150, and the first redistribution structure 140. For example, the first and second electrical devices (170_1 and 170_2) are IPDs. The second electrical device 170_2 may be electrically coupled to one or more die(s) underlying the second redistribution structure 190, depending on the product requirements.

Referring to FIG. 1F and with reference to FIG. 1E, the temporary carrier 51 may be removed by a suitable process, such as etching, grinding, mechanical peeling-off, etc., to accessibly reveal the connecting film DF1 (if any) and the back surfaces (120b and 130b) of the second die 120 and the first insulating encapsulation 130. In an embodiment where an adhesive layer (e.g., a LTHC film) is formed on the temporary carrier 51, the temporary carrier 51 is de-bonded by exposing to a laser or UV light. The laser or UV light breaks the chemical bonds of the adhesive layer that binds to the temporary carrier 51, and the temporary carrier 51 may then be de-bonded. Residues of the adhesive layer, if any, may be removed by a cleaning process performed after the carrier de-bonding process.

In some embodiments, the previous processes are performed at wafer level, and a singulation process may be performed to cut through the first insulating encapsulation 130, the first redistribution structure 140, the second insulating encapsulation 180, and the second redistribution structure 190, so as to form a respective semiconductor package 10A. In some embodiments, the semiconductor package 10A has a coterminous sidewall 10s including the sidewalls of the first insulating encapsulation 130, the first dielectric layer 142 of the first redistribution structure 140, the second insulating encapsulation 180, and the second dielectric layer 192 of the second redistribution structure 190.

As shown in FIG. 1F, the semiconductor package 10A may include a first tier T1_1 stacked on a second tier T2_1, where the first tier T1_1 includes the first and second dies (110 and 120), the first insulating encapsulation 130, and the first redistribution structure 140, and the second tier T2_1 includes the third dies (160_1 and 160_2), the first and second electrical devices (170_1 and 170_2), the TIVs 150, the second insulating encapsulation 180, the second redistribution structure 190, and the conductive terminals 195. In some embodiments, the second die 120, such as a memory package component, is disposed in proximity to the first die 110 (e.g., the SoC die) at the same tier in order to reduce the overall thickness of the semiconductor package 10A, as compared to a package structure having the memory package component stacked over the SoC die. In some embodiments, the first die 110 of the semiconductor package 10A has better thermal-dissipating performance due to the connecting film DF1 disposed on the back surface 110b and having high thermal conductivity. In some embodiments, the first electrical device 170_1, such as an IPD die, is integrated into the second tier T2_1 to reduce the electrical path between the first die 110 and the electrical device 170_1, thereby improving power delivery and electrical performance.

Referring to FIG. 1G and with reference to FIG. 1F, in the top view, a plurality of first electrical devices 170_1 may be arranged in a column between the third dies (160_1 and 160_2). It should be noted that the number and the arrangement of the first electrical devices 170_1 are merely an example and construe no limitation in the disclosure. In some embodiments, an orthographic projection area of the column of the first electrical devices 170_1 is fully within an orthographic projection area of the first die 110. In some embodiments, an orthographic projection area of the third die (160_1 and/or 160_2) at least partially overlaps the orthographic projection area of the first die 110. The third dies (160_1 and 160_2) may have the same orthographic projection area or may have different orthographic projection areas. The boundary of the third die (160_1 and/or 160_2) may extend beyond the boundary of the first die 110, in the top view. In some embodiments, the orthographic projection area of the third die 160_2 partially (or fully) overlaps an orthographic projection area of the second die 120. The orthographic projection area of the first die 110 may be less than the orthographic projection area of the second die 120. It should be noted that the configuration shown in FIG. 1G is merely an example, and the number and the arrangement of these dies and electrical devices can be adjusted depending on product requirements.

Figure 2A:
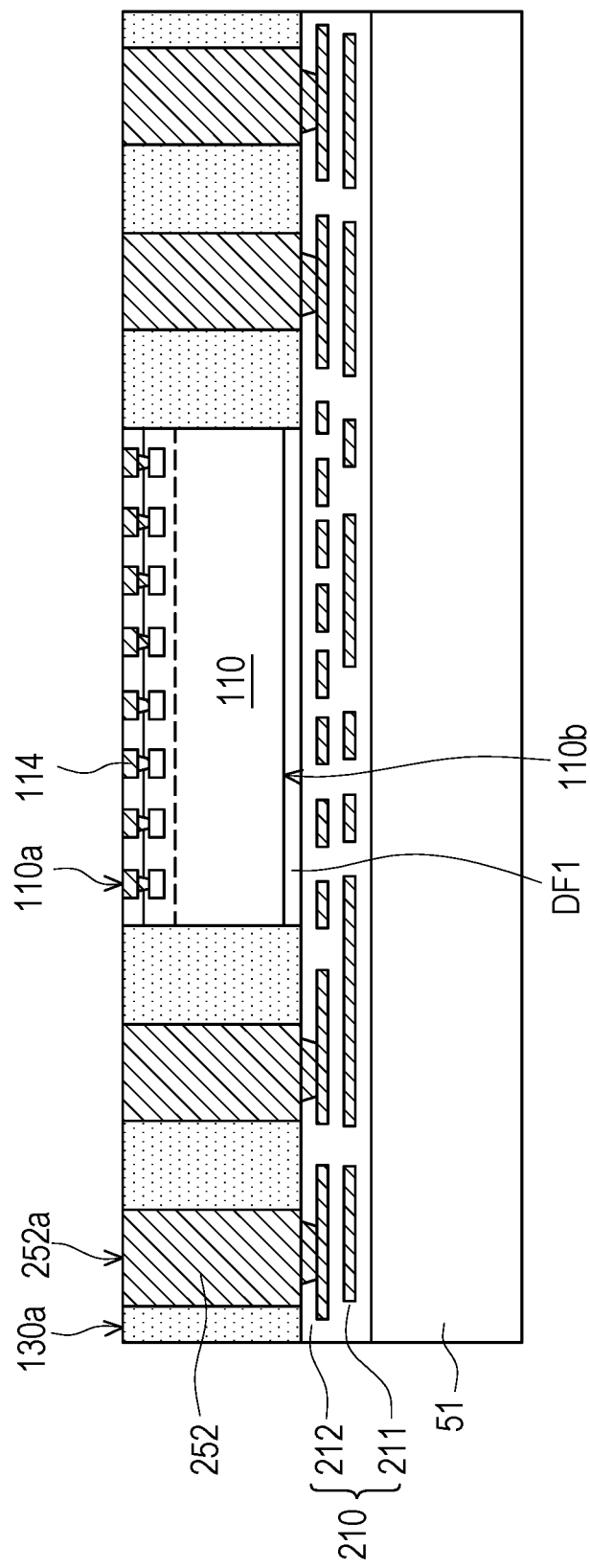
FIGS. 2A-2E are schematic cross-sectional views illustrating various stages of a manufacturing method of a semiconductor package having a back-to-face configuration, in accordance with some embodiments.
Figure 2B:
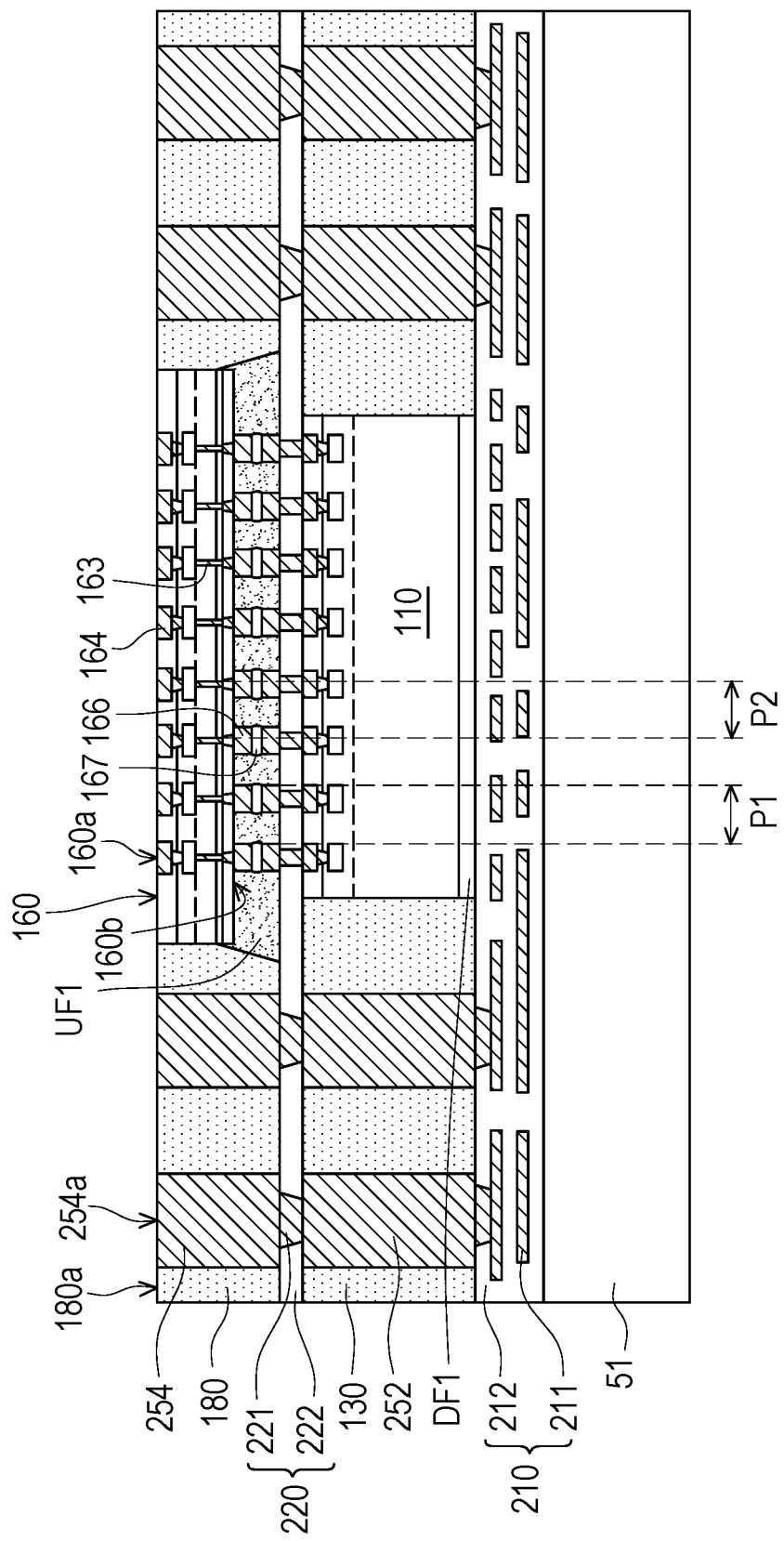
Figure 2C:
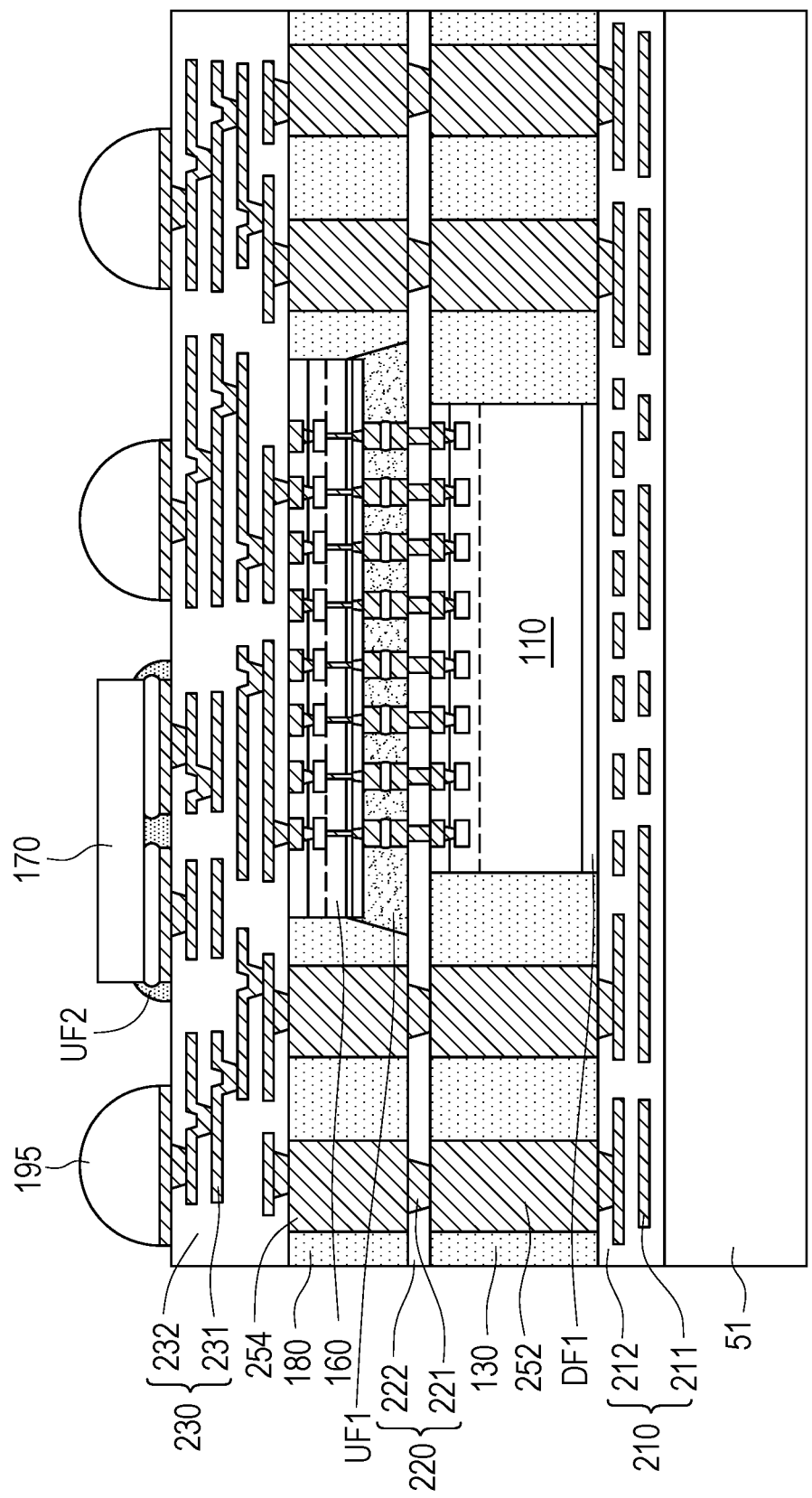
Figure 2D:
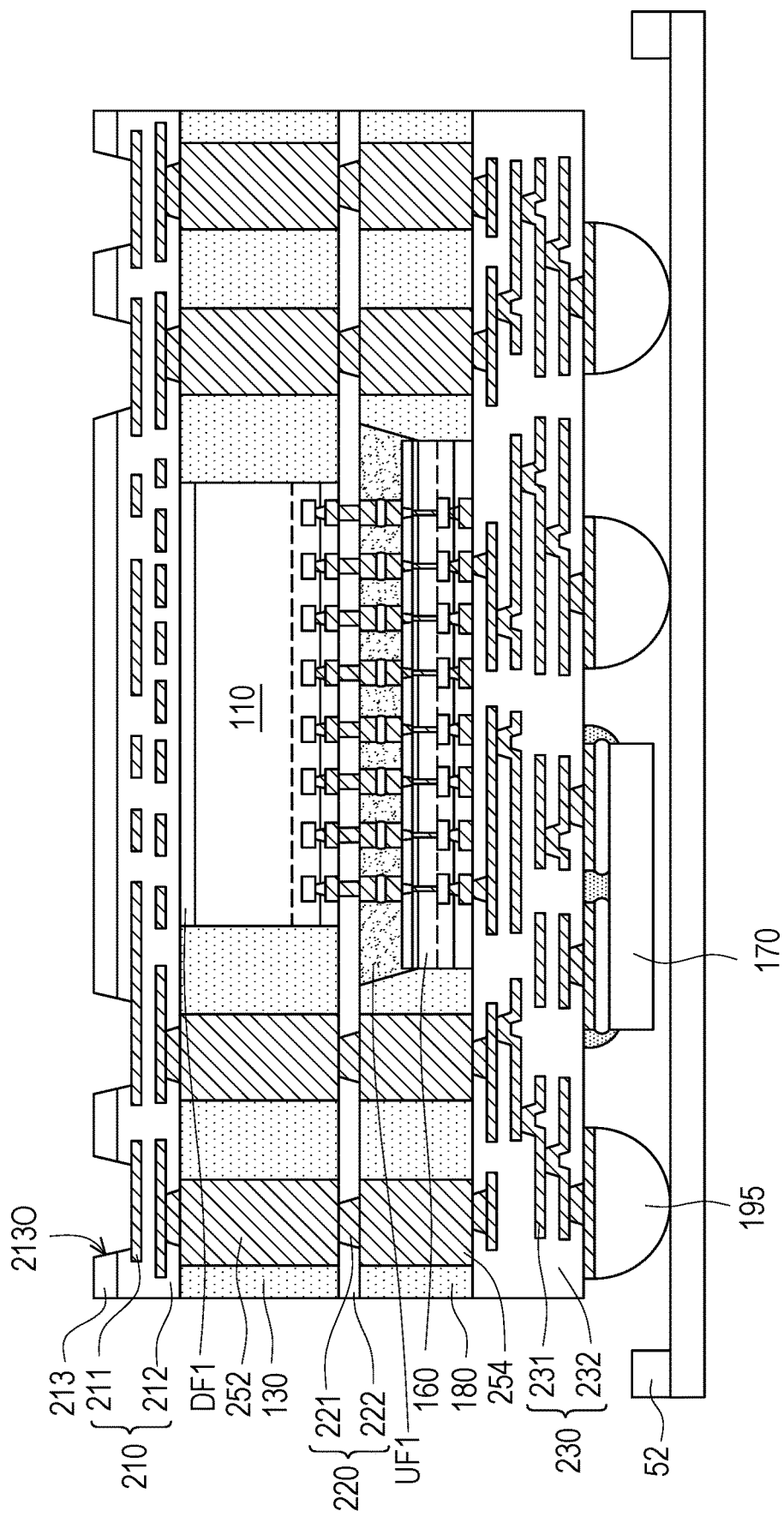
Figure 2E:
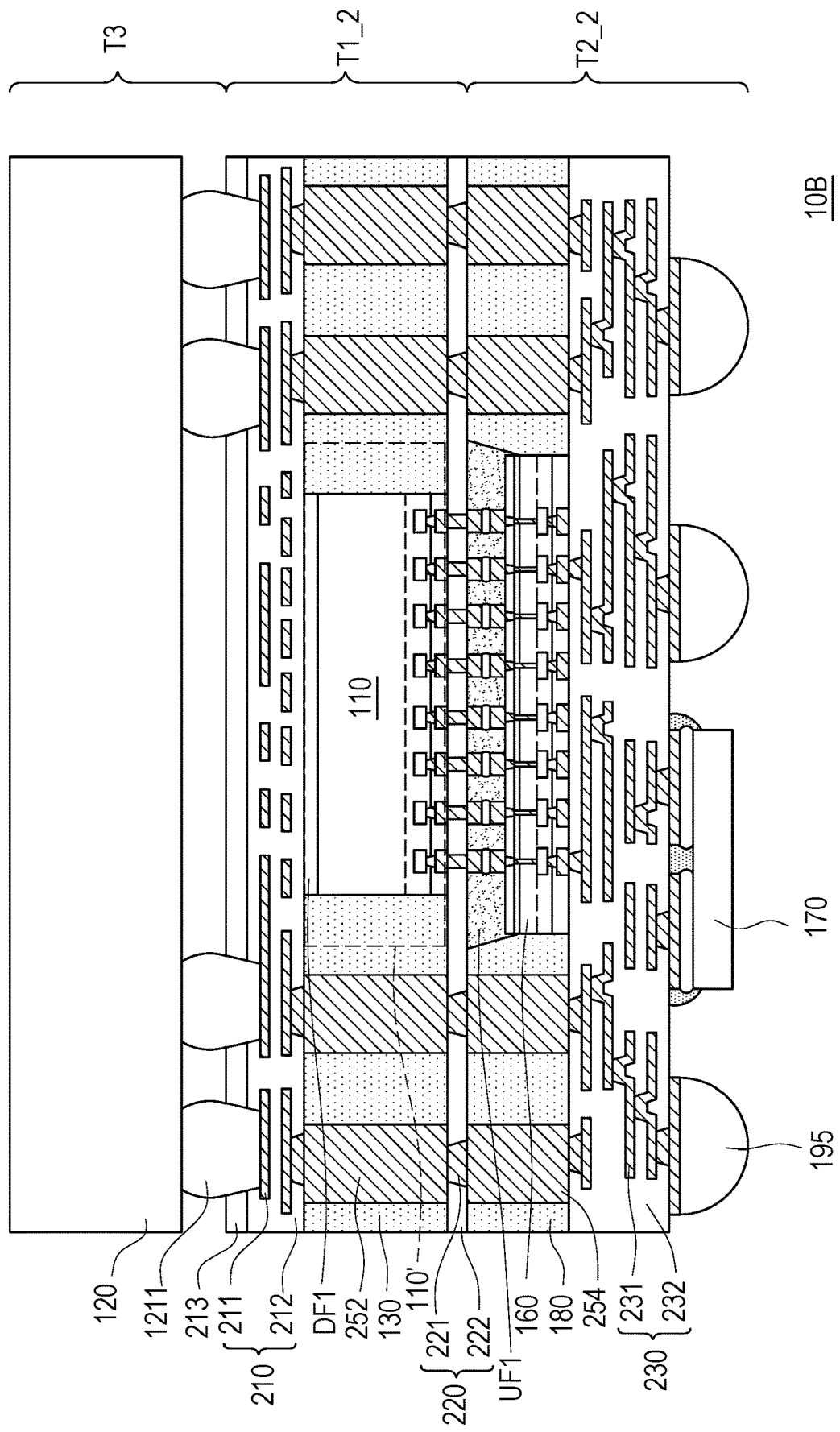

FIGS. 2A-2E are schematic cross-sectional views illustrating various stages of a manufacturing method of a semiconductor package having a back-to-face configuration, FIG. 2F is a schematic top view illustrating a configuration of various dies and electrical devices in the semiconductor package of FIG. 2E, in accordance with some embodiments. Unless specified otherwise, the materials and the formation methods of the components in these embodiments are essentially the same as the like components, which are denoted by like reference numerals in the embodiments.

Referring to FIG. 2A, a backside redistribution structure 210 may be formed on the temporary carrier 51. The backside redistribution structure 210 may include one or more backside patterned conductive layer(s) 211 formed in one or more backside dielectric layer(s) 212. The materials and the forming methods of the backside patterned conductive layer 211 and the backside dielectric layer 212 may be similar to those of the first patterned conductive layer 141 and the first dielectric layer 142, respectively. In some embodiments, first TIVs 252 may be formed on the backside redistribution structure 210 and electrically coupled to the backside patterned conductive layer 211. The first TIVs 252 may be similar to the TIVs 150 described in FIG. 1D.

In some embodiments, the first die 110 is attached to the backside dielectric layer 212 of the backside redistribution structure 210 through the connecting film DF1. The connecting film DF1, such as a die attach film or the like, may be attached to the back surface 110b of the first die 110. In some embodiments, the first insulating encapsulation 130 is formed on the backside redistribution structure 210 to laterally cover the first TIVs 252, the first die 110, and the connecting film DF1. The first die 110 and the first insulating encapsulation 130 may be similar to the first die 110 and the first insulating encapsulation 130 described in FIGS. 1A-1B. The first die connectors 114 of the first die 110 and the first TIVs 130 may be accessibly revealed for further electrical connection. In some embodiments, the top surface 130a of the first insulating encapsulation 130 is substantially leveled with the top surfaces 252a of the first TIVs 252, and the active surface 110a of the first die 110.

Referring to FIG. 2B and with reference to FIG. 2A, a middle redistribution structure 220 may be formed on the first insulating encapsulation 130, the first TIVs 252, and the first die 110. The middle redistribution structure 220 may include one or more middle patterned conductive layer(s) 221 formed in one or more middle dielectric layer(s) 222. The materials and the forming methods of the middle patterned conductive layer 211 and the middle dielectric layer 212 may be similar to those of the backside patterned conductive layer 211 and the backside dielectric layer 222, respectively. The middle patterned conductive layer 221 may be physically and electrically coupled to the top surfaces 252a of the first TIVs 252, and the first die connectors 114 of the first die 110. In some embodiments, the middle patterned conductive layer 211 includes conductive vias and conductive pads overlying the conductive vias and is free of conductive lines. The pitch P1 of the adjacent conductive pads of the middle patterned conductive layer 211 may be substantially the same as the pitch of the adjacent first and third die connectors. By way of example and not limitation, the pitch P1 is about 25 μm. Alternatively, the middle redistribution structure 220 is a multi-layered redistribution structure having multiple layers of routing, depending on the circuit design.

In some embodiments, second TIVs 254 are formed on the middle redistribution structure 220 and electrically coupled to the middle patterned conductive layer 221. The second TIVs 254 may be similar to the TIVs 150 described in the preceding paragraphs. In some embodiments, a third die 160 is mounted on the middle redistribution structure 220 and electrically coupled to the middle patterned conductive layer 221 through the conductive joints 167. The third die 160 may be similar to the third dies (160_1 and 160_2) described in FIG. 1D. In some embodiments, the TSVs 163 of the third die 160 has a critical dimension less than the pitch P1. For example, the critical dimension of the respective TSV 163 is in a range of about 2 µm to about 6 µm. The pitch P2 of the adjacent TSVs 163 may be less than the pitch P1. For example, the pitch P2 is in a range of about 9 µm to about 24 µm. The back surface 160b of the third die 160 faces the active surface of the first die 110, and such configuration may be referred to as the back-to-face configuration.

The first underfill layer UF1 is optionally formed in a gap between the back surface 160b of the third die 160 and the middle redistribution structure 220 to surround the conductive joints 167, the third die connectors 166, and the corresponding conductive pads of the middle patterned conductive layer 221. In some embodiments, the second insulating encapsulation 180 is formed on the middle redistribution structure 220 to laterally cover the second TIVs 254, the third die 160, and the first underfill layer UF1. The second insulating encapsulation 180 may be similar to the second insulating encapsulation 180 described in FIG. 1D. For example, the top surface 180a of the second insulating encapsulation 180 is substantially leveled (or coplanar) with the top surfaces 254a of the second TIVs 254 and the front surface 160a of the third die 160, where the front surface 160a includes exposed surfaces of the front-side connectors 164 for further electrical connection.

Referring to FIG. 2C with reference to FIG. 2B, a front-side redistribution structure 230 may be formed on the second insulating encapsulation 180, the second TIVs 254, and the third die 160. The front-side redistribution structure 230 may include one or more front-side patterned conductive layer(s) 231 formed in one or more front-side dielectric layer(s) 232. The materials and the forming methods of the front-side patterned conductive layer 231 and the front-side dielectric layer 232 may be respectively similar to those of the second patterned conductive layer 191 and the second dielectric layer 192 described in FIG. 1E. For example, the bottommost sublayer of the front-side patterned conductive layer 231 is in physical and electrical contact with the top surfaces 254a of the second TIVs 254 and the exposed surfaces of the front-side connectors 164 of the third die 160. The topmost sublayer of the front-side patterned conductive layer 231 may include UBM pads for further electrical connection. Subsequently, the conductive terminals 195 may be formed on a portion of the UBM pads of the front-side patterned conductive layer 231. In some embodiments, at least one electrical device 170, such as the IPD, is mounted on the other portion of the UBM pads of the front-side patterned conductive layer 231 and surrounded by the conductive terminals 195. The conductive terminals 195 and the electrical device 170 may be similar to the conductive terminals 195 and the second electrical device 170_2 described in FIG. 1E.

Referring to FIG. 2D and with reference to FIG. 2C, the structure of FIG. 2C may be flipped upside-down, and the conductive terminals 195 and/or the electrical device 170 may be disposed on a frame 52. The temporary carrier 51 may be removed to accessibly reveal the backside redistribution structure 210 by a method similar to the descriptions related to FIG. 1F, and thus the detailed descriptions are not repeated. In some embodiments, a patterned dielectric layer 213 may be formed on the outermost sublayer of the backside dielectric layer 212. The patterned dielectric layer 213 may be or include organic dielectric material, such as a solder resist film, an Ajinomoto Buildup Film (ABF), or the like. In some embodiments, the patterned dielectric layer 213 is referred to as a patterned resist layer. The patterned dielectric layer 213 may include openings 2130, and at least a portion of the outermost sublayer of the backside patterned conductive layer 211 may be accessibly revealed by the openings 2130 for further electrical connection.

Referring to FIG. 2E and with reference to FIG. 2D, the second die 120, such as the memory package component, may be mounted on the backside redistribution structure 210 through conductive joints 1211, e.g., solder joints. The second die 120 may be similar to the second die 120 described in FIG. 1A. For example, the second die connectors of the second die 120 are disposed on the portions of backside patterned conductive layer 211 exposed by the openings 2130, and then a reflow process is performed to form the conductive joints 1211 coupling the second die 120 to the backside patterned conductive layer 211. In some embodiments, an underfill layer (not shown) is formed in a gap between the second die 120 and the patterned dielectric layer 213 to surround the conductive joints 1211. In some embodiments, the aforementioned processes are performed at wafer level, and a singulation process is performed to cut through the patterned dielectric layer 213, the backside redistribution structure 210, the first insulating encapsulation 130, the middle redistribution structure 220, the second insulating encapsulation 180, and the front-side redistribution structure 230, so as to form a respective semiconductor package 10B.

With continued reference to FIG. 2E and also referring to FIG. 1F, the semiconductor package 10B is similar to the semiconductor package 10A, and thus the detailed descriptions are not repeated. For example, the semiconductor package 10B may include a first tier T1_2 stacked on a second tier T2_2, and a third tier T3 stacked on the first tier T1_2, where the first tier T1_2 is free of the second die 120, the second die 120 is included at the third tier T3. The second tier T2_2 may (or may not) be free of the electrical device 170_1. The first die 110 at the first tier T1_2 and the second die 160 at the second tier T2_2 may be arranged in the back-to-face configuration. The first tier T1_2 may include the backside redistribution structure 210 and the middle redistribution structure 220 respectively disposed at the backside and the front-side of the first die 110, and the middle redistribution structure 220 and the front-side redistribution structure 230 respectively disposed at the backside and the front-side of the third die 160.

Referring to FIG. 2F and with continued reference to FIG. 2E, the lateral dimension of the first die 110 may be less than that of the third die 160. For example, in the top view, the orthographic projection area of the first die 110 is fully located within the orthographic projection area of the third die 160. The lateral dimension of the third die 160 may be less than that of the second die 120. For example, in the top view, the orthographic projection area of the third die 160 is fully located within the orthographic projection area of the second die 120. The boundary of the orthographic projection area of the second die 120 may (or may not) be coincided with the sidewalls (or boundary) 10s of the semiconductor package 10B. In some embodiments where the first die 110 is replaced with a larger first die 110', the lateral dimension of the first die 110' is greater than that of the third die 160, and the orthographic projection area of the first die 110' as indicated in the dashed lines encircles the orthographic projection area of the third die 160. It should be noted that the configuration shown in FIG. 2F is merely an example, and the number and the sizes of the first, second, and third dies can be adjusted depending on product requirements, thereby increasing the design flexibility.

FIGS. 3A-3E are schematic cross-sectional views illustrating various stages of a manufacturing method of a semiconductor package having a face-to-face configuration, in accordance with some embodiments. Unless specified otherwise, the materials and the formation methods of the components in these embodiments are essentially the same as the like components, which are denoted by like reference numerals in the embodiments.

Figure 3A:
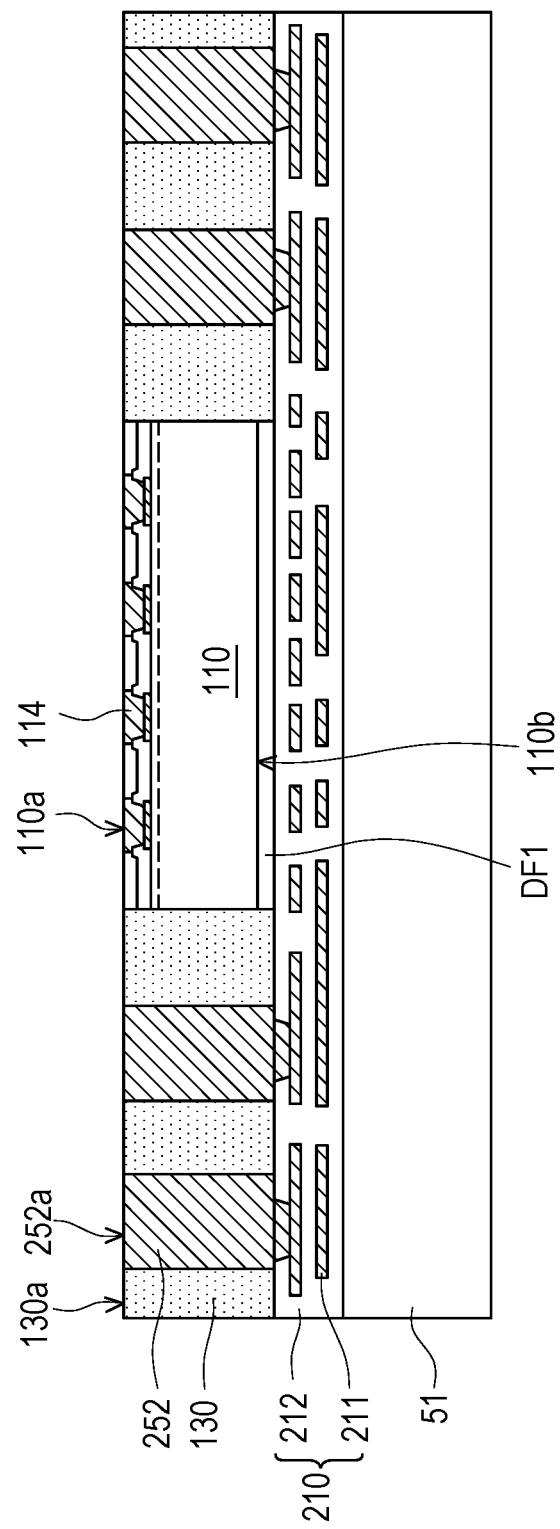
FIGS. 3A-3E are schematic cross-sectional views illustrating various stages of a manufacturing method of a semiconductor package having a face-to-face configuration, in accordance with some embodiments.

Referring to FIG. 3A and with reference to FIG. 2A, the structure shown in FIG. 3A is similar to the structure described in FIG. 2A. The backside redistribution structure 210 including the backside patterned conductive layer 211 and the backside dielectric layer 212 may be formed on the temporary carrier 51. The first TIVs 252 may be formed on the backside redistribution structure 210 and electrically coupled to the backside patterned conductive layer 211. The first die 110 may be attached to the backside dielectric layer 212 of the backside redistribution structure 210 through the connecting film DF1 on the back surface 110b of the first die 110. The first insulating encapsulation 130 may be formed on the backside redistribution structure 210 to laterally cover the first TIVs 252, the first die 110, and the connecting film DF1. The first die connectors 114 of the first die 110 and the first TIVs 130 may be accessibly revealed for further electrical connection. For example, the top surface 130a of the first insulating encapsulation 130 is substantially leveled with the top surfaces 252a of the first TIVs 252, and the active surface 110a of the first die 110.

Figure 3B:
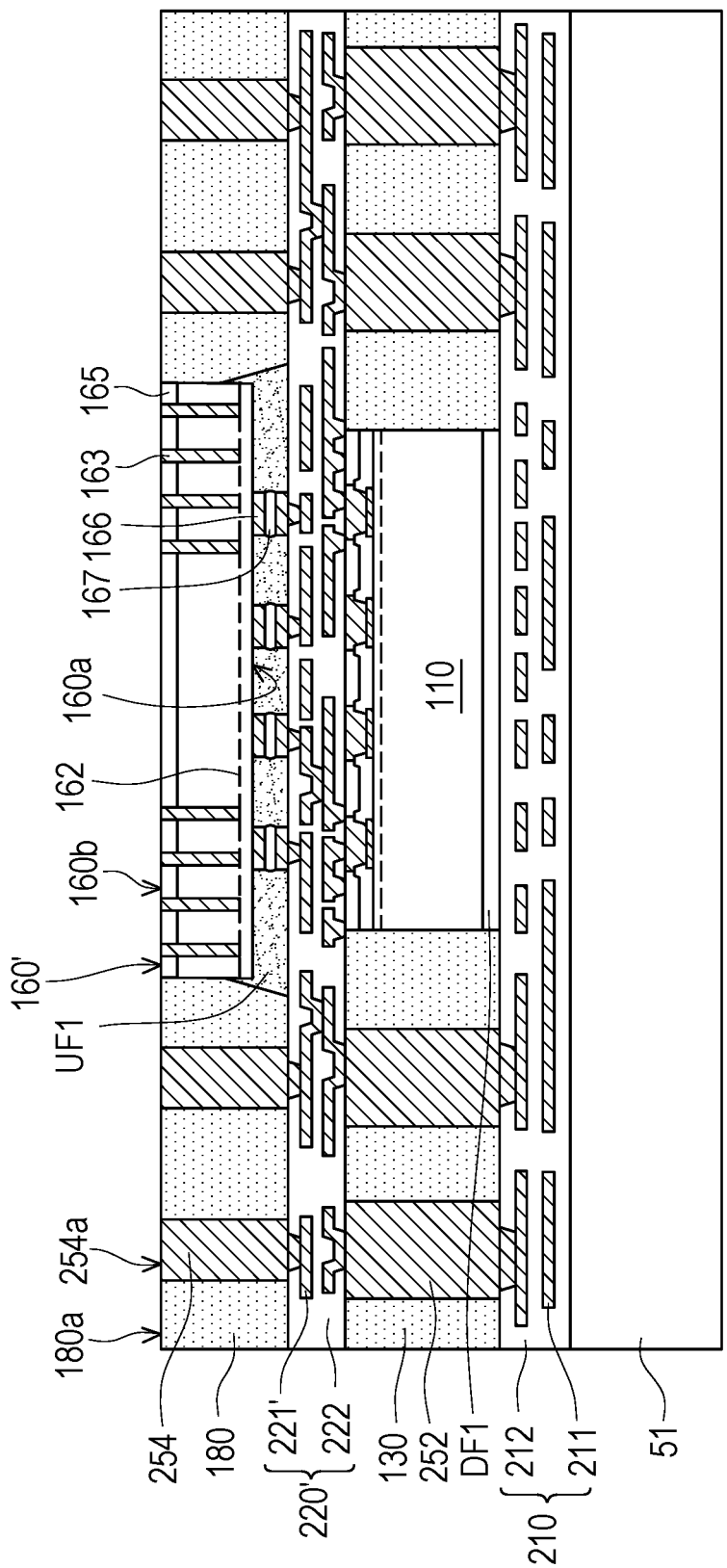

Referring to FIG. 3B and with reference to FIG. 2B, the structure shown in FIG. 3B is similar to the structure described in FIG. 2B, except that the third die 160' and the first die 110 are arranged in a face-to-face configuration, and the middle redistribution structure 220' includes multiple levels of routing. For example, the middle redistribution structure 220 including the middle patterned conductive layer 221' and the middle dielectric layer 222 is first formed on the first insulating encapsulation 130, the first TIVs 252, and the third die 110. Next, the second TIVs 254 may be formed on the middle redistribution structure 220 and electrically coupled to the middle patterned conductive layer 221. The third die connectors 166 of the third die 160' may then be mounted on the topmost sublayer of the middle patterned conductive layer 221' through the conductive joints 167, where the front surface 160a of the third die 160' may face the active surface of the first die 110. For example, the third device layer 162 is in proximity to the first die 110, and the isolation layer 165 laterally covering the TSVs 163 is distal from the first die 110. The third die 160' may be similar to the third die 160 described in FIG. 2B, and it should be noted that not all of the elements in the third die 160' are illustrated herein for simplification.

In some embodiments, the first underfill layer UF1 is formed in a gap between the front surface 160a of the third die 160' and the middle redistribution structure 220' to surround the conductive joints 167, the third die connectors 166, and the corresponding conductive pads of the middle patterned conductive layer 221'. In some embodiments, the second insulating encapsulation 180 is formed on the middle redistribution structure 220' to laterally cover the second TIVs 254, the third die 160', and the first underfill layer UF1. For example, the top surface 180a of the second insulating encapsulation 180 is substantially leveled (or coplanar) with the top surfaces 254a of the second TIVs 254 and the back surface 160b of the third die 160', where the surfaces 163a of the TSVs 163 are accessibly exposed by the isolation layer 165 and the second insulating encapsulation 180 for further electrical connection. In some embodiments, the isolation layer 165 is formed after forming the second insulating encapsulation 180. The various formations of the isolation layer 165 of the third die 160' will be discussed in accompanying with FIGS. 4A-4D and FIGS. 5A-5C.

Figure 3C:
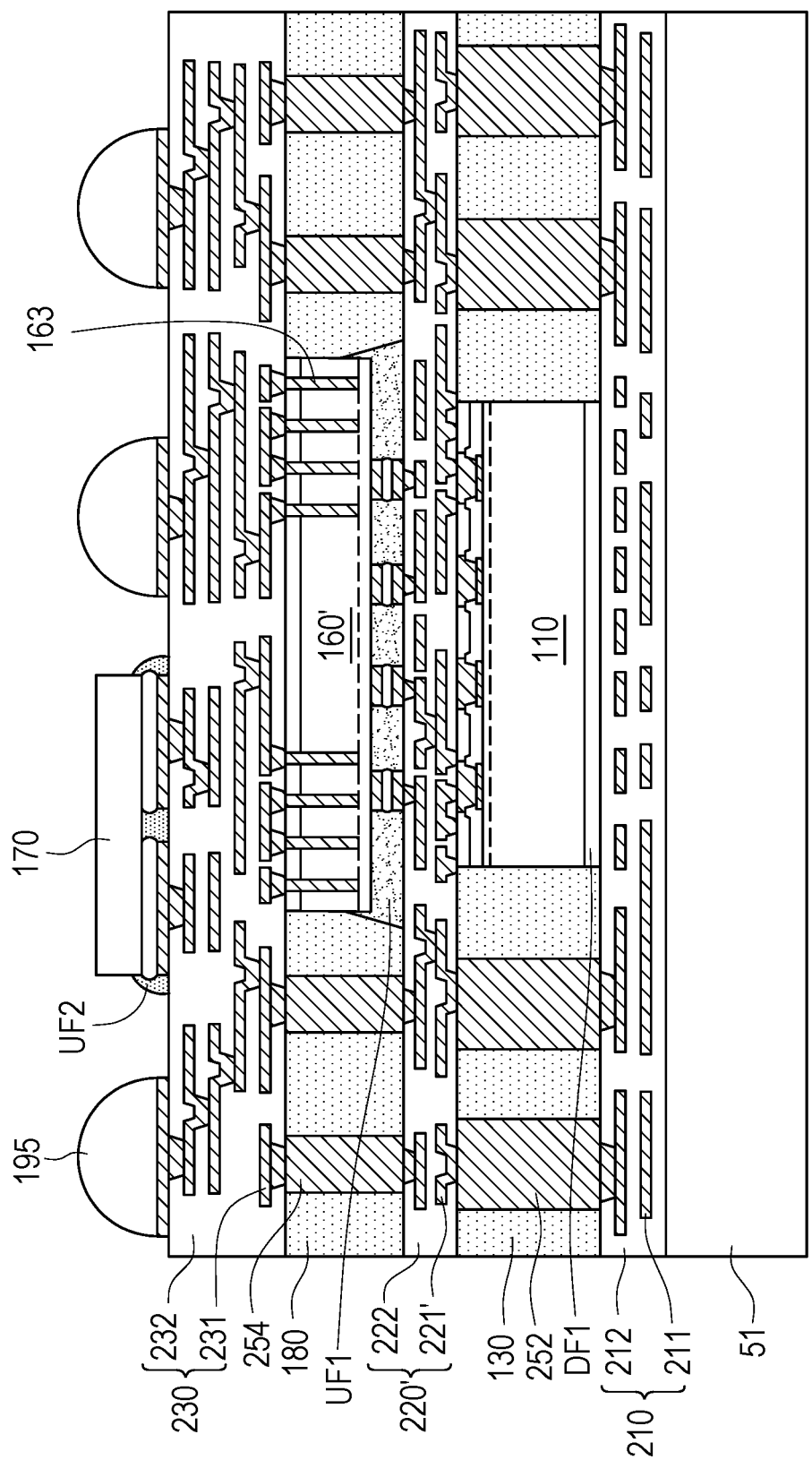

Referring to FIG. 3C and with reference to FIG. 2C, the structure shown in FIG. 3C is similar to the structure described in FIG. 2C. For example, the front-side redistribution structure 230 including the front-side patterned conductive layer 231 and the front-side dielectric layer 232 is formed on the second insulating encapsulation 180, the second TIVs 254, and the third die 160'. For example, the bottommost sublayer of the front-side patterned conductive layer 231 is in physical and electrical contact with the exposed surfaces of the second TIVs 254 and the TSVs 163 of the third die 160'. The topmost sublayer of the front-side patterned conductive layer 231 may include UBM pads, and the conductive terminals 195 may be formed on a portion of the UBM pads of the front-side patterned conductive layer 231. In some embodiments, at least one electrical device 170, such as the IPD, is mounted on the other portion of the UBM pads of the front-side patterned conductive layer 231 and surrounded by the conductive terminals 195.

Figure 3D:
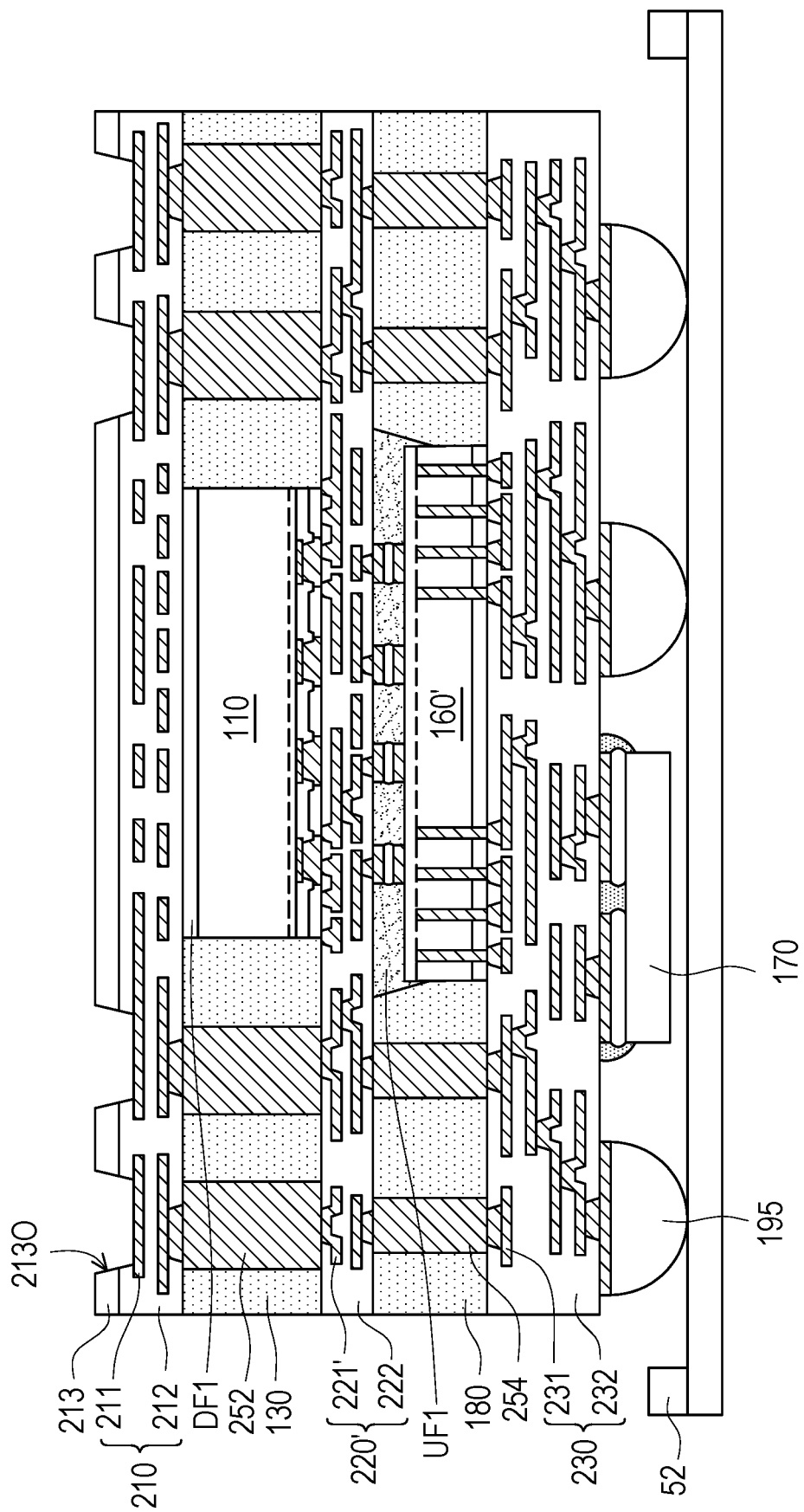

Referring to FIG. 3D and with reference to FIGS. 3C and 2D, the structure shown in FIG. 3D is similar to the structure described in FIG. 2D. For example, the structure of FIG. 3C may be flipped upside-down, and the conductive terminals 195 and/or the electrical device 170 may be disposed on the frame 52. The temporary carrier 51 may be removed to accessibly reveal the backside redistribution structure 210, and then the patterned dielectric layer 213 having the openings 2130 may be formed on the outermost sublayer of the backside dielectric layer 212.

Figure 3E:
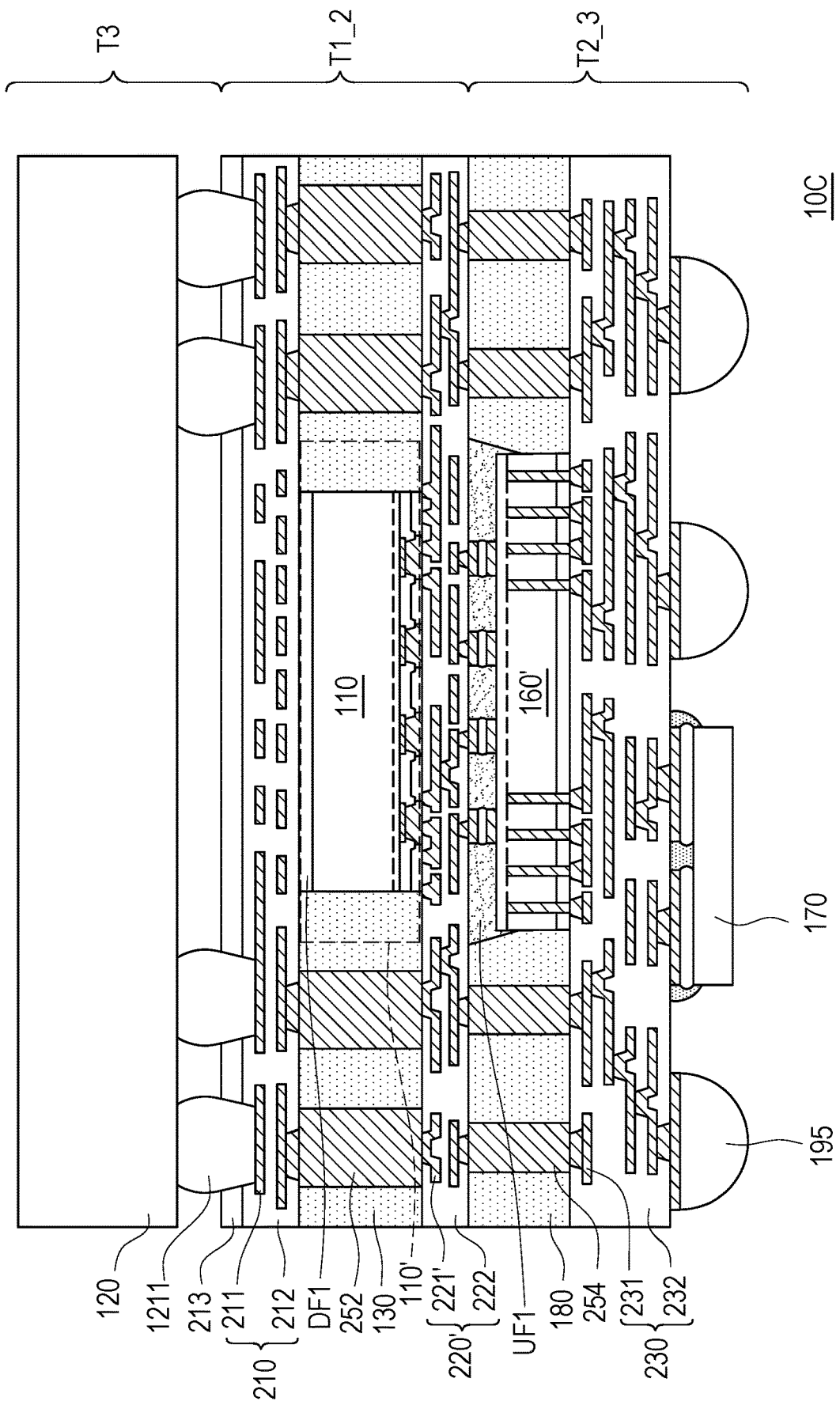

Referring to FIG. 3E and with reference to FIG. 2E, the structure shown in FIG. 3E is similar to the structure described in FIG. 2E. For example, the second die 120, such as the memory package component, may be mounted on the backside redistribution structure 210 through the conductive joints 1211. An underfill layer (not shown) is optionally formed in a gap between the second die 120 and the patterned dielectric layer 213 to surround the conductive joints 1211. In some embodiments, a singulation process is performed to cut through the patterned dielectric layer 213, the backside redistribution structure 210, the first insulating encapsulation 130, the middle redistribution structure 220', the second insulating encapsulation 180, and the front-side redistribution structure 230, so as to form a respective semiconductor packages 10C.

The semiconductor package 10C, similar to the semiconductor package 10B shown in FIG. 2E, may include the first tier T1_2 stacked on a second tier T2_3, and a third tier T3 stacked on the first tier T1_2. The main difference between the semiconductor package 10C and the semiconductor package 10B lies in that the first die 110 in the first tier T1_2 and the third die 160' in the second tier T2_3 are arranged in the face-to-face configuration, where the active surface of the third die 160' at the second tier T2_3 faces the active surface of the first die 110, and the middle redistribution structure 220' is interposed between and electrically coupled to the active surfaces of the first and third dies 110 and 160. The top view of the semiconductor package 10C may be similar to the top view described in FIG. 2F, and the first die 110 may be replaced with a larger first die 110' as described in the preceding paragraphs, and thus the detailed descriptions are not repeated for the sake of brevity.

FIGS. 4A-4D are schematic cross-sectional views illustrating the formation of an isolation layer on a back surface of the third die, in accordance with some embodiments. The steps of forming the isolation layer and the redistribution structure may correspond to the processes described in FIGS. 3B-3C. Unless specified otherwise, the materials and the formation methods of the components in these embodiments are essentially the same as the like components, which are denoted by like reference numerals in the embodiments.

Figures 4A, 4B:
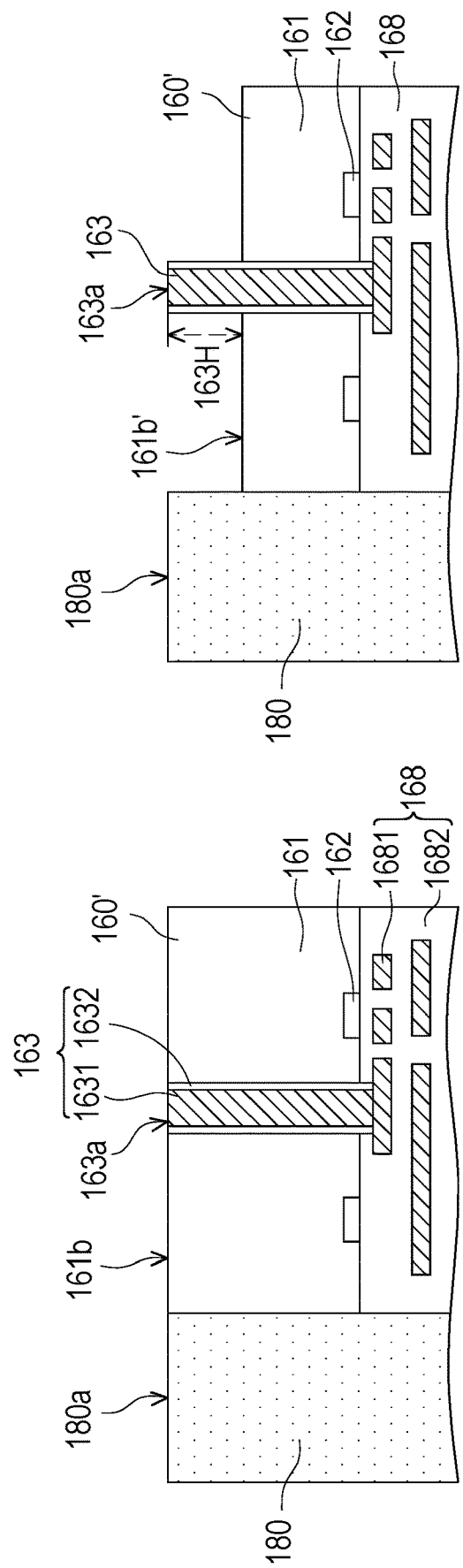
FIGS. 4A-4D and 5A-5C are schematic cross-sectional views illustrating the formation of an isolation layer on a back surface of the third die, in accordance with some embodiments.

Referring to FIG. 4A, the second insulating encapsulation 180 is formed to extend along the sidewall of the third die 160'. The interconnect structure 168 of the third die 160' may be disposed below the third device layer 162 and the TSV 163, and the third device layer 162 formed in/on the third semiconductor substrate 161 may be electrically coupled to the TSV 163 through the interconnect conductive layer 1681 embedded in the interconnect dielectric layer 1682. The TSV 163 may include a conductive pillar 1631 lining with a liner 1632, where the conductive pillar 1631 is isolated from the third semiconductor substrate 161 through the liner 1632. By way of example and not limitation, the critical dimension 1631D of the conductive pillar 1631 is about 2 µm, and the thickness of the liner 1632 is less than the critical dimension 1631D, e.g., about 0.15 µm. In some embodiments, after the planarization process is performed on the second insulating encapsulation 180, the top surface 180a is substantially leveled with the back surface 161b of the third semiconductor substrate 161 and the surface 163a of the TSV 163.

Referring to FIG. 4B, a backside of the third semiconductor substrate 161 may be thinned down to form a recess on the back surface 161b'. For example, an etching process is performed on the backside of the third semiconductor substrate 161, while the second insulating encapsulation 180 is covered by a masking layer (not shown) during the etching. After the etching, an upper portion of the TSV 163 is exposed and protruded from the back surface 161b' of the third semiconductor substrate 161. By way of example and not limitation, the height 163H of the exposed portion of the TSV 163 measured from the surface 163a to the back surface 161b' is about 2 µm (or less than 2 µm).

Figures 4C, 4D:
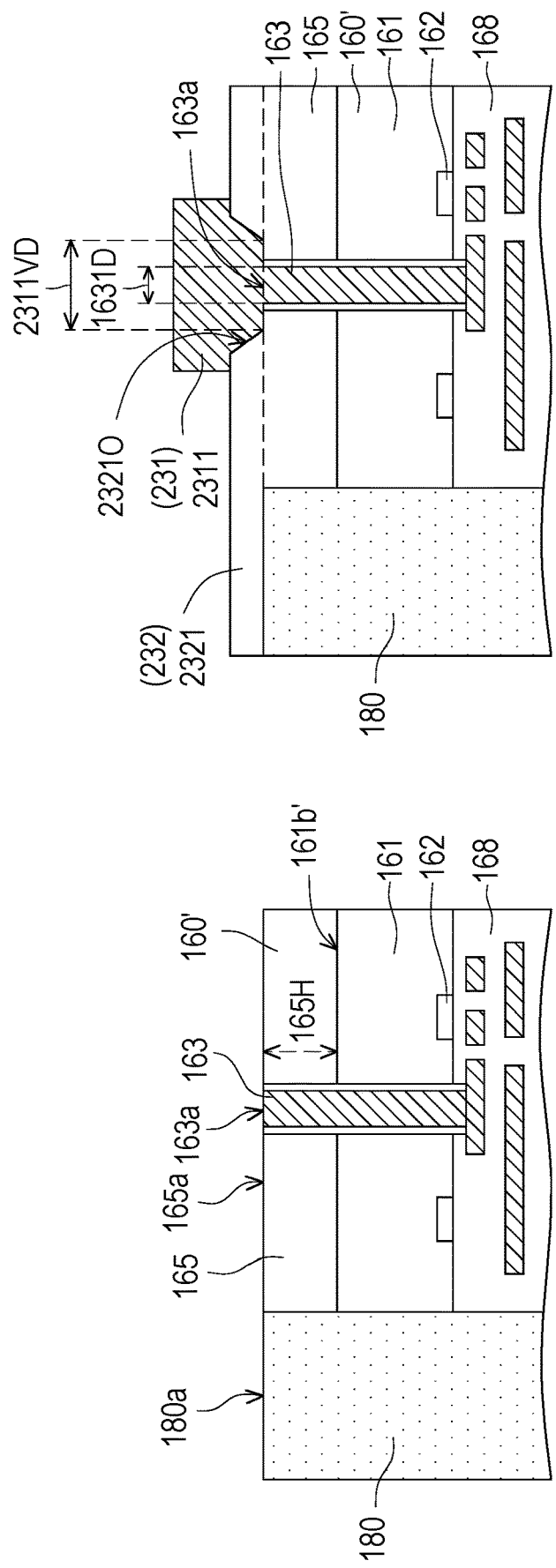

Referring to FIG. 4C, the isolation layer 165 may be formed on the back surface 161b' of the third semiconductor substrate 161 to laterally cover the exposed portion of the TSV 163. In some embodiments, the isolation layer 165 is a dielectric (e.g., a low temperature polyimide material), and may be formed by coating and curing, etc. Although any other suitable dielectric material and deposition process may also be used to form the isolation layer 165. In some embodiments, a planarization process is performed to level the top surface 180a of the second insulating encapsulation 180, the top surface 165a of the isolation layer 165, and the surface 163a of the TSV 163, within process variations. For example, the thickness 165H of the isolation layer 165 is about 1.5 µm to about 2 µm.

Referring to FIG. 4D, the bottommost sublayer 2321 having an opening 23210 of the front-side dielectric layer 232 may be formed on the second insulating encapsulation 180 and the isolation layer 165, where the opening 23210 may accessibly exposed the TSV 163. In some embodiments, a portion of the top surface of the isolation layer 165 surrounding the surface of the TSV 163 may also be accessibly revealed by the opening 23210. The bottommost sublayer 2321 may include polyimide, and an interface be observed between the bottommost sublayer 2321 and the underlying isolation layer 165. Next, the bottommost sublayer 2311 of the front-side patterned conductive layer 231 including the conductive via and the overlying conductive pad may be formed in the opening 23210 and on the top surface of the bottommost sublayer 2321. In some embodiments, the conductive via of the bottommost sublayer 2311 of the front-side patterned conductive layer 231 has a tapered profile toward the TSV 163, and the narrower end of the conductive via has the lateral dimension 2311VD greater than the critical dimension 1631D of the underlying TSV 163. By way of example and not limitation, the lateral dimension 2311VD of the conductive via of the front-side patterned conductive layer 231 is about 8 µm. In such embodiments, the narrower end of the conductive via is in physical contact with the surface 163a of the TSV 163 and the portion of the top surface of the isolation layer 165 surrounding the surface 163a of the TSV 163.

Figure 5A:
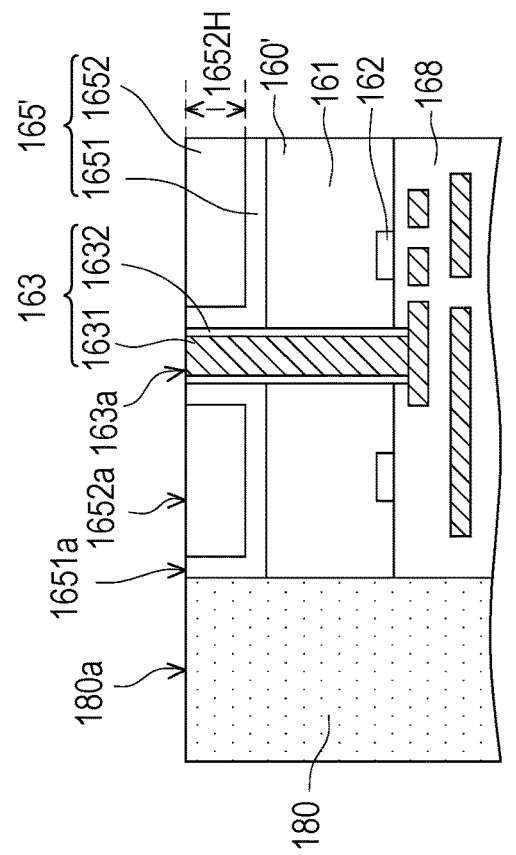
Figure 5B:
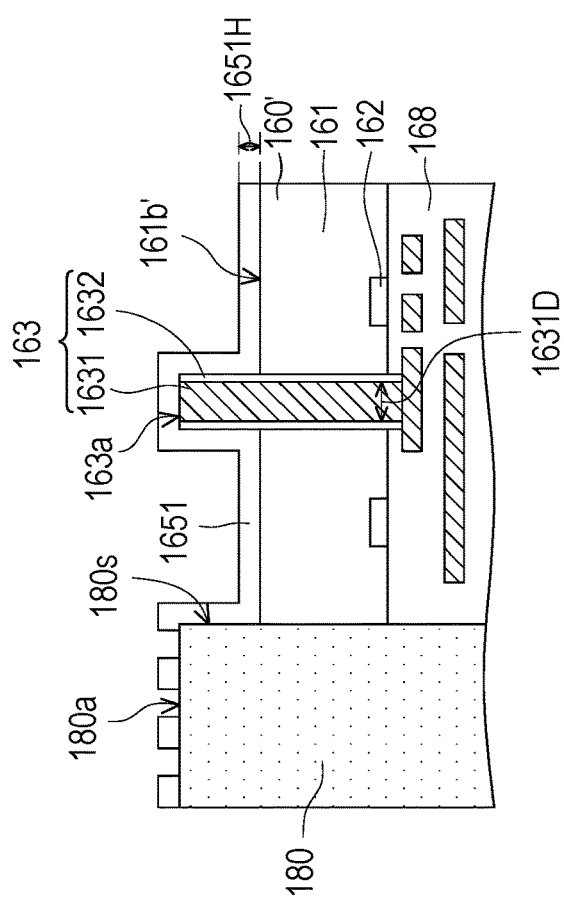
Figure 5C:
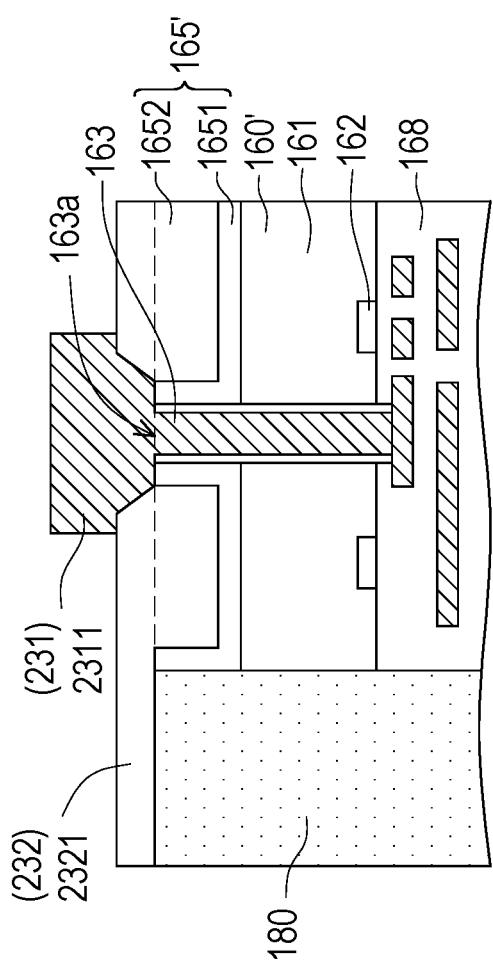

FIGS. 5A-5C are schematic cross-sectional views illustrating another formation of an isolation layer on a back surface of the third die, in accordance with some embodiments. The steps of FIGS. 5A-5C may be similar to the steps described in FIG. 4A-4D, and thus the detailed descriptions are not repeated. The like components are denoted by like reference numerals in the embodiments.

Referring to FIG. 5A, after recessing the backside of the third semiconductor substrate 161 as described in FIG. 4B, a first isolation sublayer 1651 may be formed on the second insulating encapsulation 180, the third semiconductor substrate 161, and the TSV 163. The first isolation sublayer 1651 may include (or may be) silicon nitride-based material, such as SiN or other suitable dielectric material, and may be deposited at low temperature. The first isolation sublayer 1651 may be conformally formed on the back surface 161b' of the third semiconductor substrate 161, and the sidewalls and the top exposed surface 163a of the TSV 163. The first isolation sublayer 1651 may extend to cover the exposed sidewall 180s and the top surface 180a of the second insulating encapsulation 180. In some embodiments, a portion of the first isolation sublayer 1651 formed on the top surface 180a of the second insulating encapsulation 180 is formed as islands spatially apart from each other, and portions of the top surface 180a of the second insulating encapsulation 180 which are covered by the islands are accessibly exposed. In some embodiments, the thickness 1651H of the first isolation sublayer 1651 is less than about half of the critical dimension 1631D. By way of example and not limitation, the thickness 1651H of the first isolation sublayer 1651 is about 0.5 µm.

Referring to FIG. 5B and with reference to FIG. 5A, a second isolation sublayer 1652 may be formed on the first isolation sublayer 1651. The second isolation sublayer 1652 may thus be separated from the third semiconductor substrate 161 and the second insulating encapsulation 180 by the first isolation sublayer 1651. The second isolation sublayer 1652 and the first isolation sublayer 1651 may be of different materials and different thicknesses. For example, the second isolation sublayer 1652 is a dielectric (e.g., a low temperature polyimide material), and may be formed by coating and curing, etc. The second isolation sublayer 1652 may be thicker than the first isolation sublayer 1651. By way of example and not limitation, the thickness 1652H of the second isolation sublayer 1652 is about 1.5 µm to 2 µm. Subsequently, a planarization process (e.g., CMP, mechanical grinding, etching, a combination thereof, etc.) is performed, excess materials of the first and second isolation sublayers 1651 and 1652. For example, after the planarization process, the top surface 180*a* of the second insulating encapsulation 180 is substantially leveled with the surface 163*a* of the TIV 163, the top surface 1651*a* of the first isolation sublayer 1651, and the top surface 1652*a* of the second isolation sublayer 1652, where the first and second isolation sublayers 1651 and 1652 are collectively viewed as the isolation layer 165'.

Referring to FIG. 5C and with reference to FIG. 5B, the bottommost sublayer 2321 of the front-side dielectric layer 232 may be formed on the second insulating encapsulation 180 and the isolation layer 165', and then the bottommost sublayer 2311 of the front-side patterned conductive layer 231 may be formed in/on the bottommost sublayer 2321. The forming process may be similar to the process described in FIG. 4D. In some embodiments, the narrower end of the conductive via of the bottommost sublayer 2311 of the front-side patterned conductive layer 231 is in physical contact with the surface 163*a* of the TSV 163 and the top surface 1651*a* of the first isolation sublayer 1651 (and the top surface 1652*a* of the second isolation sublayer 1652, in some embodiments).

FIGS. 6A-6D are schematic cross-sectional views illustrating various stages of a manufacturing method of a semiconductor package having a face-to-face configuration, in accordance with some embodiments. Unless specified otherwise, the materials and the formation methods of the components in these embodiments are essentially the same as the like components, which are denoted by like reference numerals in the embodiments.

Figure 6A:
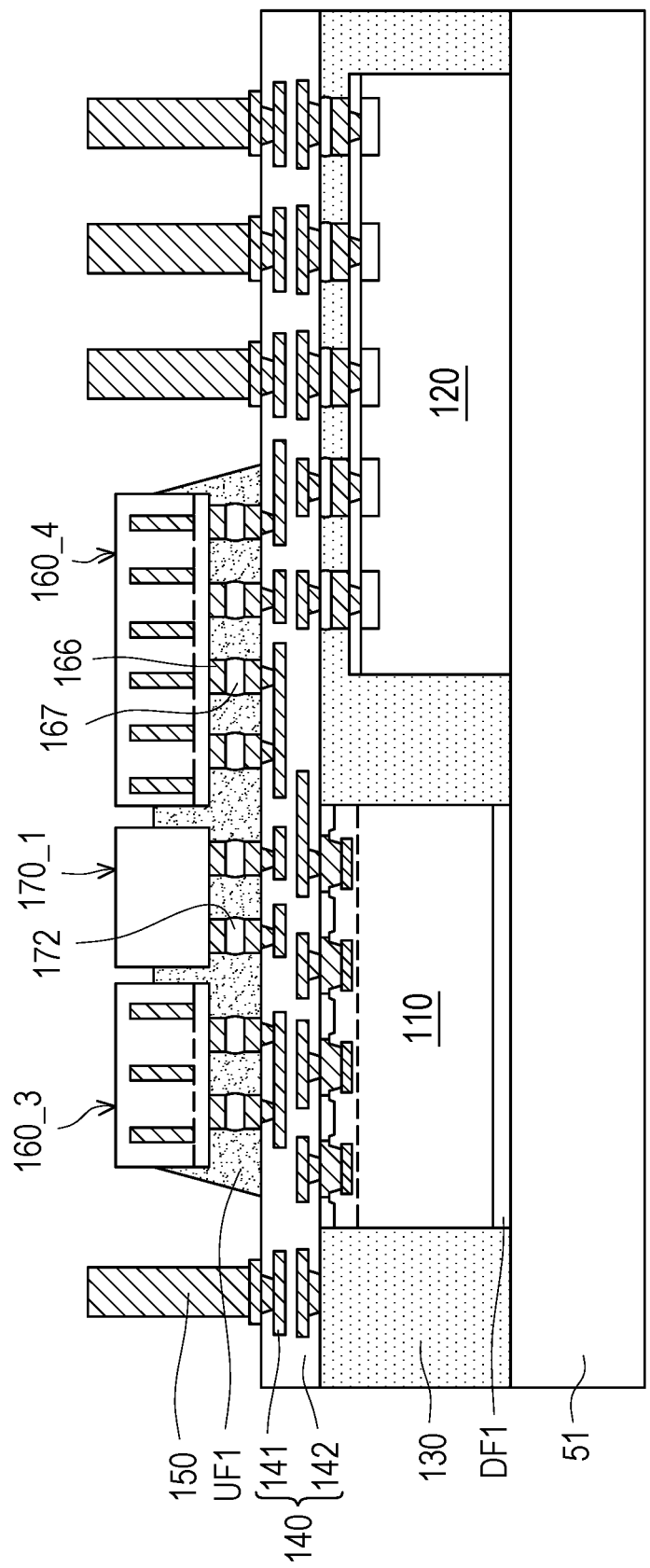
FIGS. 6A-6D are schematic cross-sectional views illustrating various stages of a manufacturing method of a semiconductor package having a face-to-face configuration, in accordance with some embodiments.

Referring to FIG. 6A and with reference to FIG. 1D, the structure of FIG. 6A is similar to the structure of FIG. 1D, and thus the detailed formation of each component is not repeated for simplicity. For example, the first and second dies 110 and 120 are laterally covered by the first insulating encapsulation 130, and the first redistribution structure 140 including the first patterned conductive layer 141 and the first dielectric layer 142 is formed on the first and second dies 110 and 120 and the first insulating encapsulation 130. Next, the conductive pillars 150 may be formed on the topmost sublayer of the first patterned conductive layer 141.

Subsequently, the third dies (160_3 and 160_4) may be mounted on the first patterned conductive layer 141 and surrounded by the conductive pillars 150. The third dies (160_3 and 160_4) may be similar to the third die 160' described in FIG. 3B. For example, the first die 110 and the third dies (160_3 and 160_4) are arranged in the face-to-face configuration, where the third die connectors 166 of the third dies (160_3 and 160_4) are mounted onto the topmost sublayer of the first patterned conductive layer 141 through the conductive joints 167. In some embodiments, the first electrical device 170_1 is disposed right over the first die 110, laterally interposed between the third dies (160_1 and 160_2), and mounted onto the topmost sublayer of the first patterned conductive layer 141 through the conductive joints 172. An underfill layer UF1 is optionally formed in gaps between the third dies 160_3 and 160_4 and the underlying first patterned conductive layer 141 and also between the first electrical device 170_1 and the first patterned conductive layer 141 to surround the conductive joints 167 and 172 for protection. The underfill layer UF1 may partially (or fully) cover the sidewalls of the first electrical device 170_1 and the third dies (160_3 and 160_4).

Figure 6B:
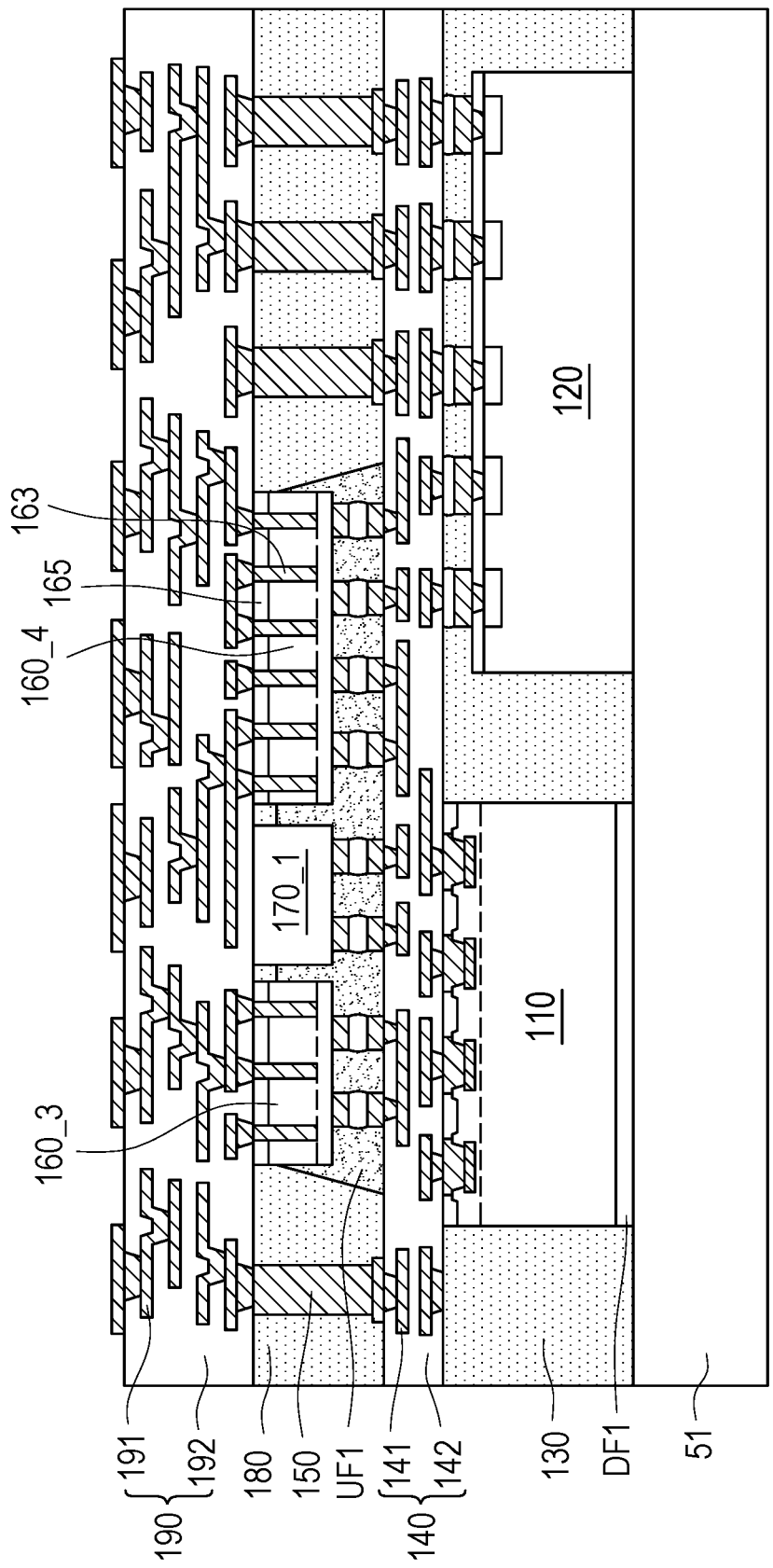

Referring to FIG. 6B and with reference to FIG. 6A, the second insulating encapsulation 180 may be formed on the first redistribution structure 140 to laterally cover the conductive pillars 150, the third dies (160_3 and 160_4), the first electrical device 170_1, and the underfill layer UF1. Since the conductive pillars 150 penetrate through the second insulating encapsulation 180, the conductive pillars 150 are referred to as the TIVs. In some embodiments, a portion of the second insulating encapsulation 180 is formed on the top surface of the underfill layer UF1 to laterally surround the sidewalls of the first electrical device 170_1. In alterative embodiments, the first electrical device 170_1 and the third dies (160_3 and 160_4) are covered by the underfill layer UF1, and the second insulating encapsulation 180 is separated from the first electrical device 170_1 and the third dies (160_3 and 160_4) by the underfill layer UF1.

In some embodiments, the isolation layer 165 of the respective third die (160_3 and 160_4) is formed after forming the second insulating encapsulation 180. The formation of the isolation layer 165 of the third die 160' may refer to the methods discussed in accompanying with FIGS. 4A-4D and FIGS. 5A-5C. In some embodiments, the second redistribution structure 190 including the second patterned conductive layer 191 and the second dielectric layer 192 is formed on the TIVs 150, the second insulating encapsulation 180, the third dies (160_3 and 160_4), and the first electrical device 170_1. For example, the second patterned conductive layer 191 is physically and electrically connected to the TIVs 150 and the TSVs 163 of the third dies (160_3 and 160_4). The materials and the forming methods of the second redistribution structure 190 may be similar to those of the second redistribution structure 190 described in FIG. 1E or the backside redistribution structure 230 described in FIG. 3C, and thus the detailed descriptions are not repeated.

Figure 6C:
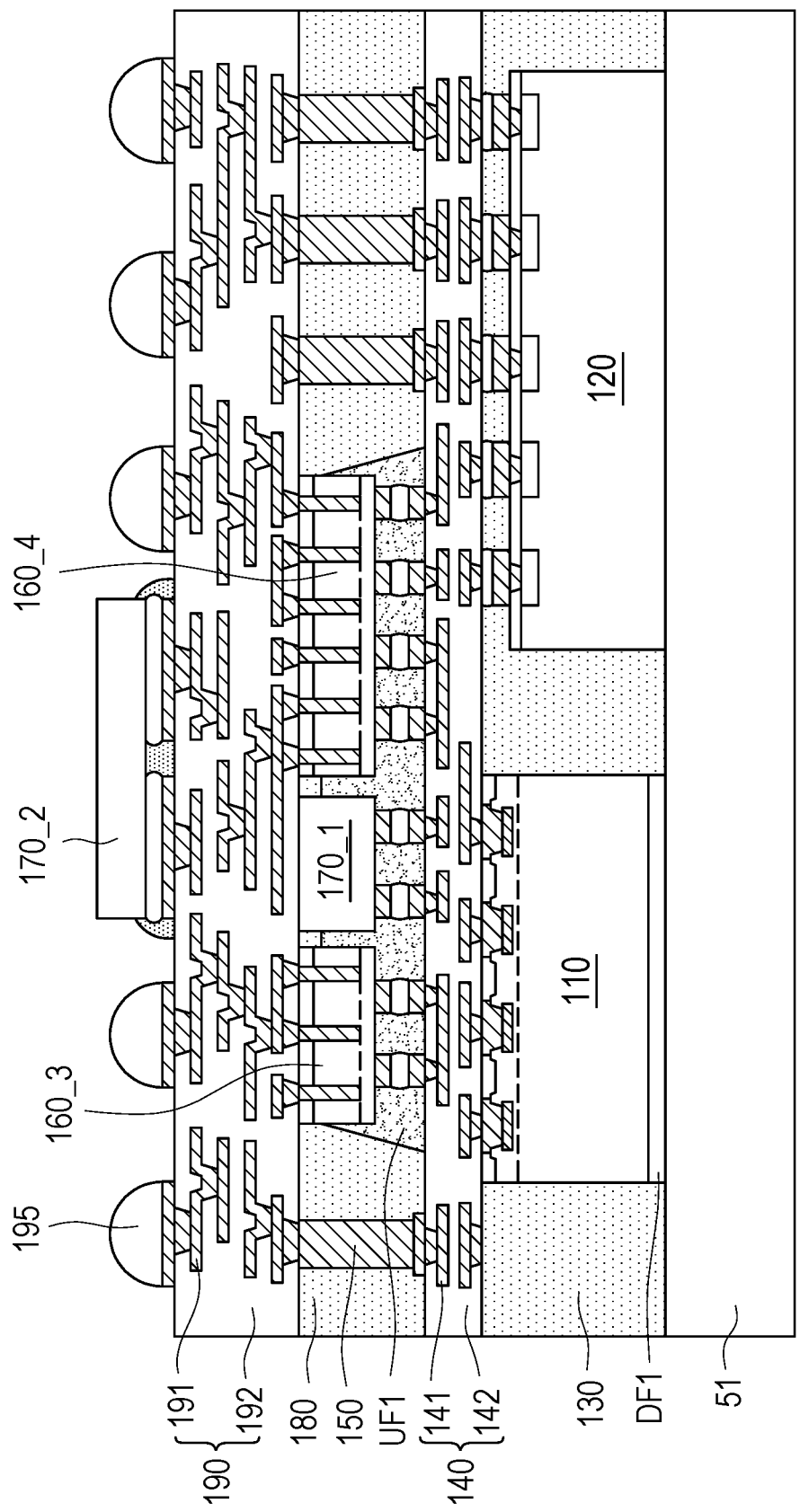

Referring to FIG. 6C, the conductive terminals 195 may be formed on a portion of the UBM pads of the topmost sublayer of the second patterned conductive layer 191. In some embodiments, at least one second electrical device 170_2, such as the IPD, is mounted on the other portion of the UBM pads of the f topmost sublayer of the second patterned conductive layer 191 and surrounded by the conductive terminals 195. The conductive terminals 195 and the electrical device 170_2 may be similar to the conductive terminals 195 and the second electrical device 170_2 described in FIG. 1E.

Subsequently, the structure of FIG. 6C may be flipped upside-down and placed on the frame, and then the temporary carrier 51 may be de-bonded to accessibly reveal the first insulating encapsulation 130, the connecting film DF1, and the second die 120. A singulation process may be performed to form a respective semiconductor package.

Figure 6D:
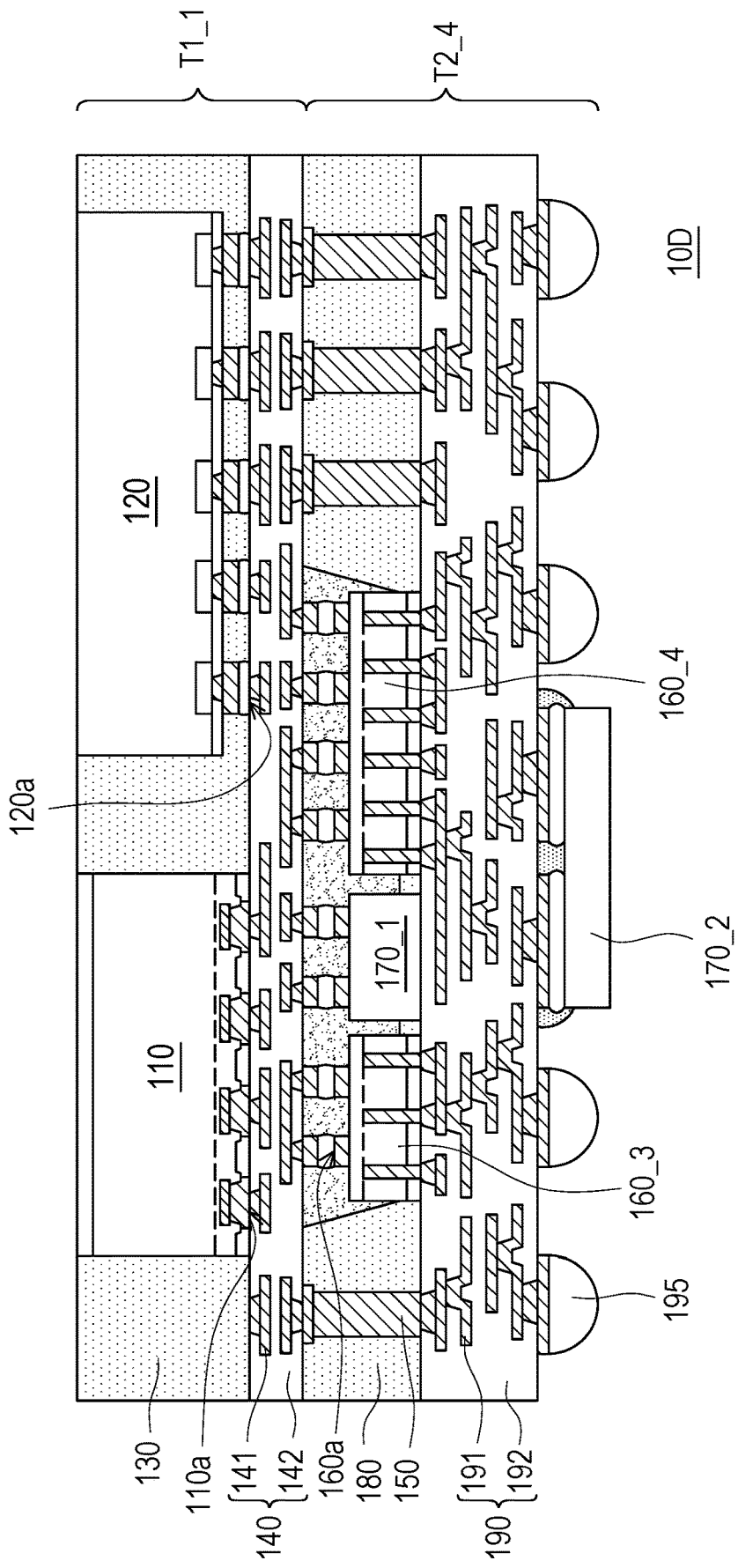

Referring to FIG. 6D, the semiconductor package 10D may include the first tier T1_1 stacked on a second tier T2_4, where the first tier T1_1 includes the first and second dies 110 and 120, the first insulating encapsulation 130, and the first redistribution structure 140, and the second tier T2_4 includes the third dies (160_3 and 160_4), the first and second electrical device 170_1 and 170_2, the TIVs 150, the second insulating encapsulation 180, the second redistribution structure 190, and the conductive terminals 195. The third dies (160_3 and 160_4) and the first die 110 are arranged in the face-to-face configuration as the first die 110 and the third die 160' of the semiconductor package 10C described in FIG. 3E. For example, the front surfaces 160*a* of the third dies (160_3 and 160_4) face the active surface 110*a* of the first die 110 and the active surface 120*a* of the second die 120. The top view of the semiconductor package 10D may be similar to the top view described in FIG. 1G, and thus the detailed descriptions are not repeated for the sake of brevity.

FIGS. 7A-7F are schematic cross-sectional views illustrating various stages of a manufacturing method of a semiconductor package having a face-to-back configuration, in accordance with some embodiments. Unless specified otherwise, the materials and the formation methods of the components in these embodiments are essentially the same as the like components, which are denoted by like reference numerals in the embodiments.

Figure 7A:
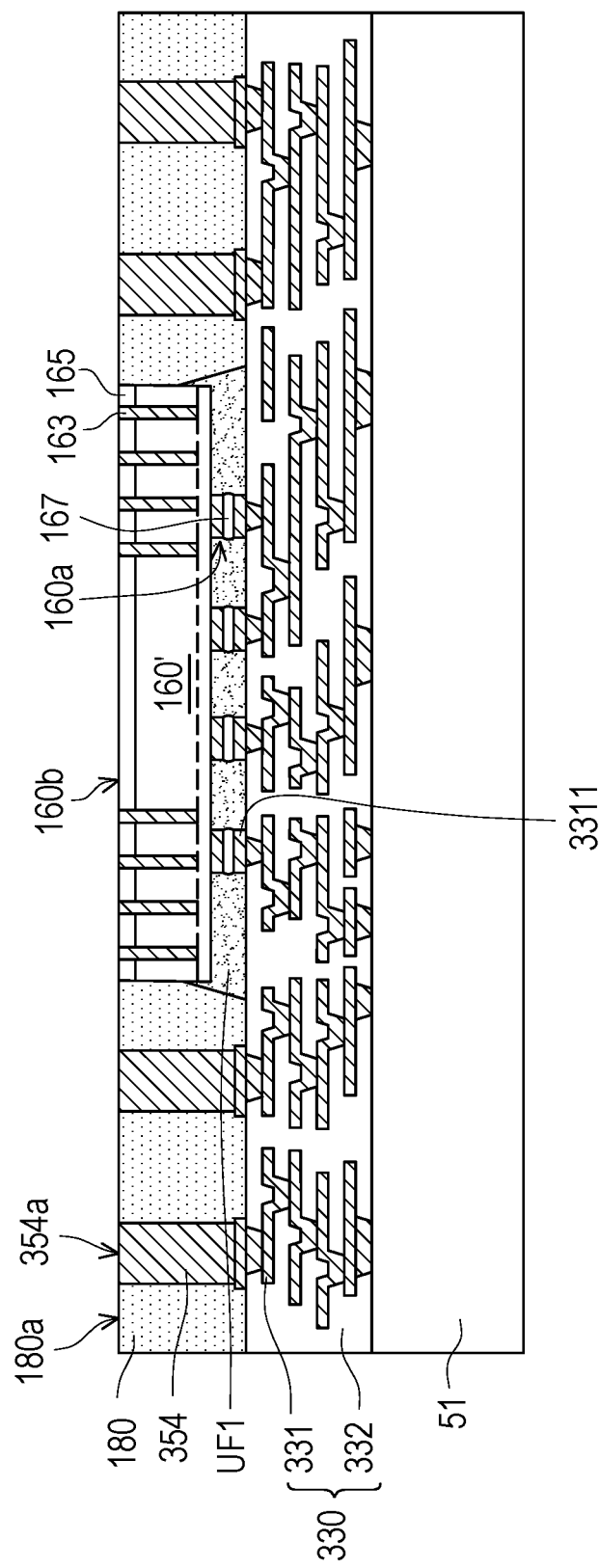
FIGS. 7A-7F are schematic cross-sectional views illustrating various stages of a manufacturing method of a semiconductor package having a face-to-back configuration, in accordance with some embodiments.

Referring to FIG. 7A, the front-side redistribution structure 330 including the front-side patterned conductive layer 331 and the front-side dielectric layer 332 may be formed over the temporary carrier 51. The front-side redistribution structure 330 may be similar to the front-side redistribution structure 230 described in the preceding paragraphs. The bottommost sublayer of the front-side dielectric layer 332 having openings may be formed over the temporary carrier 51, and then the bottommost sublayer of the front-side patterned conductive layer 331 may be formed in the openings and on the top surface of the bottommost sublayer of the front-side dielectric layer 332. The forming steps of the sublayers may repeat several times to form a multi-layered redistribution structure. The topmost sublayer of the front-side patterned conductive layer 331 may include first pads 3311 and second pads 3312 surrounding the first pads 3311 and formed on the top surface of the topmost sublayer of the front-side dielectric layer 332 for further electrical connection. The first TIVs 354 may be formed on the second pads 3312 of the front-side patterned conductive layer 331 of the front-side redistribution structure 330.

The third die 160' may be mounted on the first pads 3311 of the front-side patterned conductive layer 331 of the front-side redistribution structure 330 through the conductive joints 167, where the front surface 160a of the third die 160' face the front-side redistribution structure 330. In some embodiments, the first underfill layer UF1 is formed on the front-side redistribution structure 330 to surround the conductive joints 167 for protection. In some embodiments, the second insulating encapsulation 180 is formed on the front-side redistribution structure 330 to laterally cover the first TIVs 354, the third die 160', and the first underfill layer UF1. For example, the top surface 180a of the second insulating encapsulation 180 is substantially leveled with the top surfaces 354a of the first TIVs 354, and the back surface 160b of the third die 160', where the surfaces of the TSVs 163 and the isolation layer 165 are substantially leveled at the back surface 160b. The formation of the isolation layer 165 may be similar to the processes described in FIGS. 4A-4D or FIGS. 5A-5C.

Figure 7B:
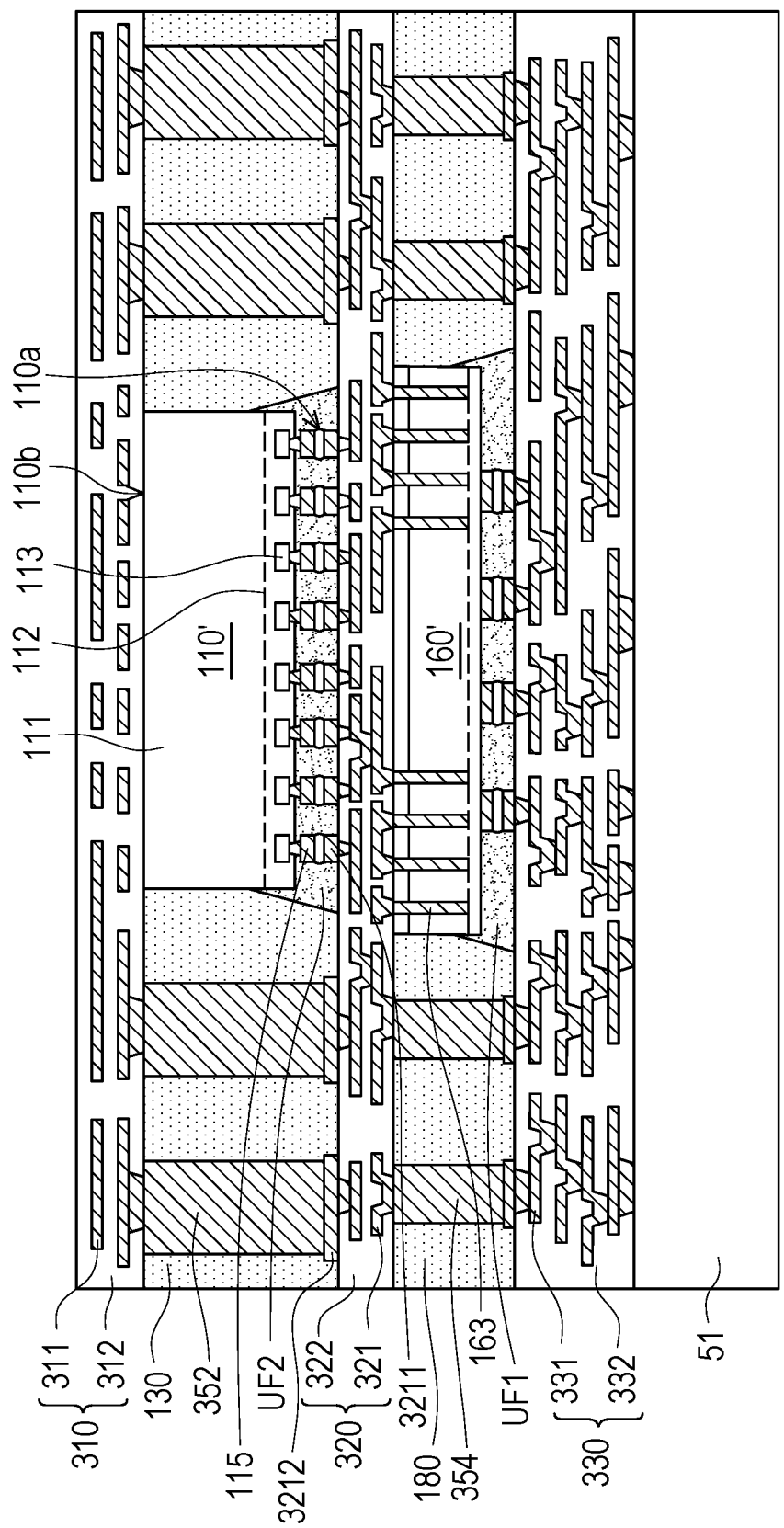

Referring to FIG. 7B, the middle redistribution structure 320 including the middle patterned conductive layer 321 and the middle dielectric layer 322 may be formed on the second insulating encapsulation 180, the first TIVs 354, and the third die 160'. The middle redistribution structure 320 may be similar to the middle redistribution structure 220' described in the preceding paragraphs. The bottommost sublayer of the middle dielectric layer 322 having openings may be formed to accessibly expose the first TIVs 354 and the TSVs 163 of the third die 160', and then the bottommost sublayer of the middle patterned conductive layer 321 may be formed in the openings to be in physical and electrical contact with the first TIVs 354 and the TSVs 163. The forming steps of the sublayers may repeat several times to form a multi-layered redistribution structure. The topmost sublayer of the middle patterned conductive layer 321 may include first pads 3211 and second pads 3212 surrounding the first pads 3211 and formed on the top surface of the topmost sublayer of the middle dielectric layer 322 for further electrical connection. The second TIVs 352 may be formed on the second pads 3212 of the middle patterned conductive layer 321 of the middle redistribution structure 320.

In some embodiments, the first die 110' is mounted onto the first pads 3211 of the middle patterned conductive layer 321 of the middle redistribution structure 320 through conductive joints 115, e.g., solder joints. The first die 110' may be similar to the first die 110 described in the preceding paragraphs. For example, the first device layer 112 underlies the first semiconductor substrate 111, the first die connectors 113 are disposed below the first device layer 112, and the conductive joints 115 are coupled to the first die connectors 113 and the first pads 3211. The active surface 110a of the first die 110' faces the back side of the third die 160', and such configuration may be referred to as the face-to-back configuration. A second underfill layer UF2 is optionally formed in a gap between the active surface 110a of the first die 110' and the middle redistribution structure 320 to surround the conductive joints 115, the first die connectors 113, and the first pads 3211.

In some embodiments, a first insulating encapsulation 130 is formed on the middle redistribution structure 320 to laterally cover the second TIVs 352, the first die 110', and the second underfill layer UF2. A planarization process (e.g., CMP, mechanical grinding, etching, a combination thereof, etc.) may be performed to substantially level the top surface 130a of the first insulating encapsulation 130, the top surface 352a of the second TIVs 352, and the back surface 110b of the first die 110'. In some embodiments, a backside redistribution structure 310 including the backside patterned conductive layer 311 and the backside dielectric layer 312 is formed on the first insulating encapsulation 130, the second TIVs 352, and the first die 110'. The backside redistribution structure 310 may be similar to the backside redistribution structure 210 described in the preceding paragraphs. For example, the bottommost sublayer of the backside patterned conductive layer 311 is physical and electrical contact with the top surface 352a of the second TIVs 352.

Figure 7C:
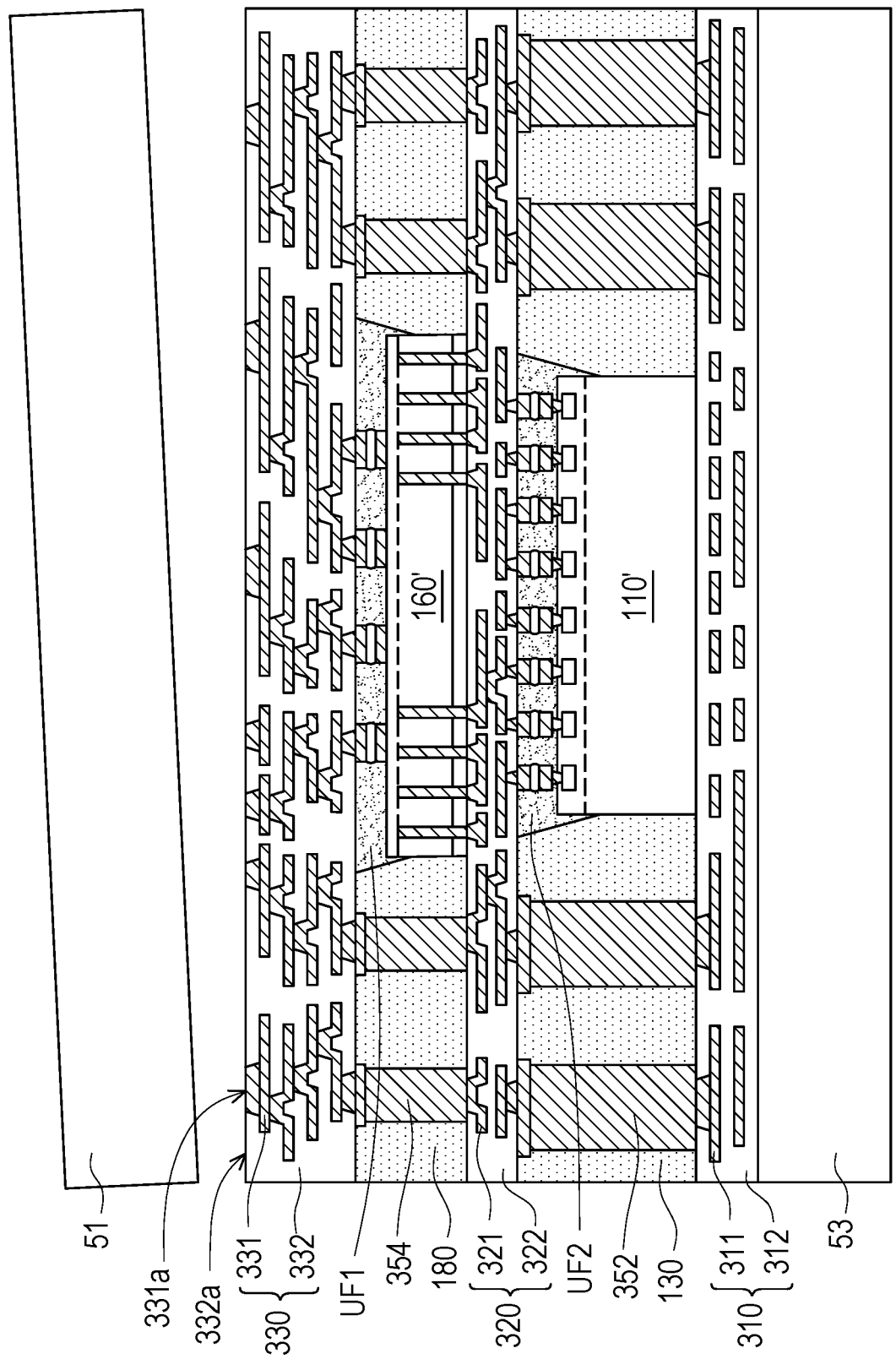

Referring to FIG. 7C and with reference to FIG. 7B, the structure of FIG. 7B may be flipped upside-down, and the backside redistribution structure 310 may be disposed over a second temporary carrier 53. The first temporary carrier 51 may then be removed to accessibly reveal the front-side redistribution structure 330. The removal of the first temporary carrier 51 may be similar to the de-bonding process described in FIG. 1F, and thus the detailed descriptions are not repeated. In some embodiments, after the removal of the first temporary carrier 51, the surfaces 331a and 332a of the front-side patterned conductive layer 331 and the front-side dielectric layer 332 are accessibly revealed.

Figure 7D:
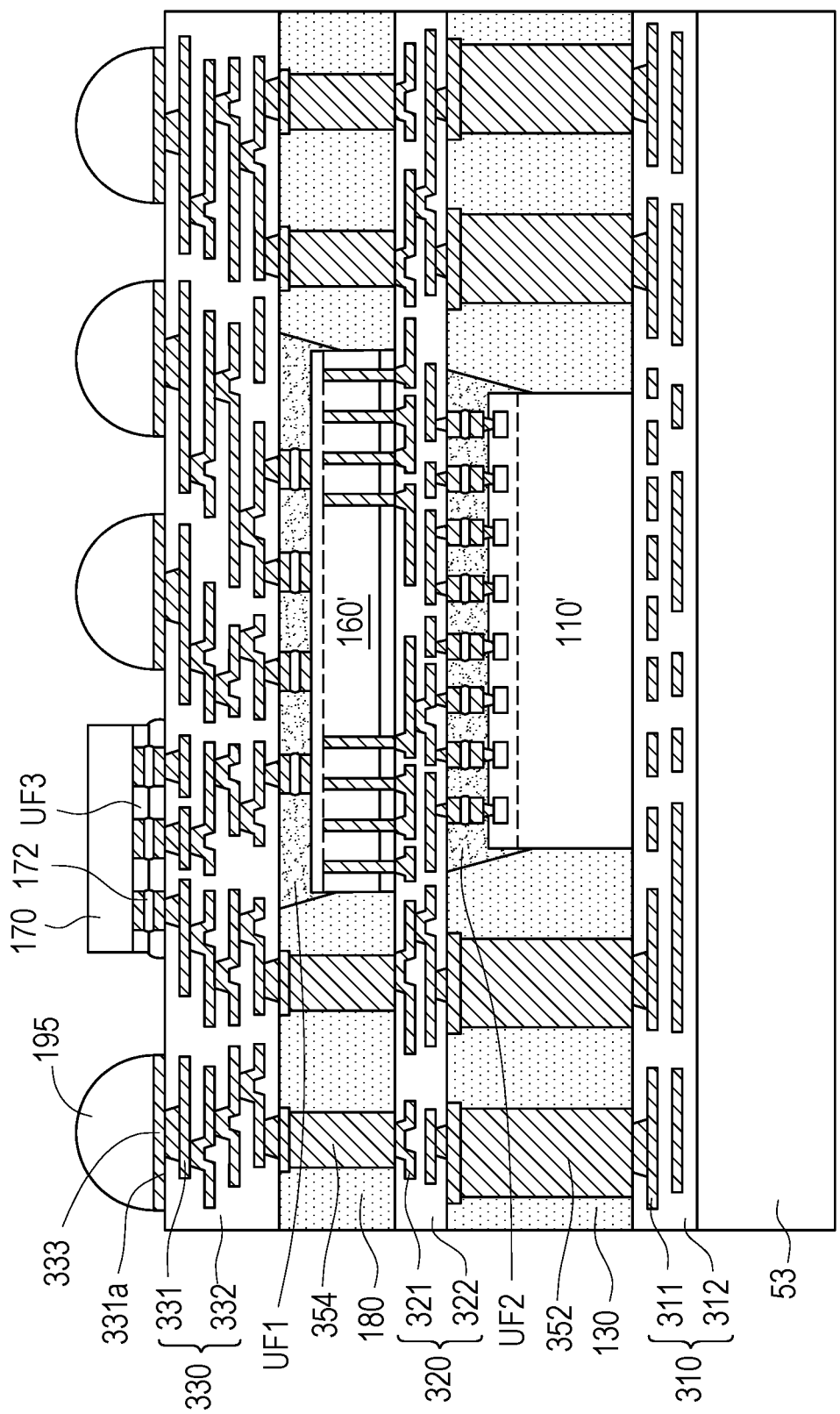

Referring to FIG. 7D and with reference to FIG. 7C, UBM pads 333 may be formed on the surfaces 331a of the front-side patterned conductive layer 331. In some embodiments, the conductive terminals 195 are formed on a portion of the UBM pads 333. The electrical device 170 is optionally formed on the other portion of the UBM pads 333 and surrounded by the conductive terminals 195 through the conductive joints 172. A third underfill layer UF3 is optionally formed in a gap between the electrical device 170 and the front-side redistribution structure 330 to surround the conductive joints 172. The conductive terminals 195 and the electrical device 170 may be similar to the conductive terminals 195 and the electrical device 170 described in FIG. 2C.

Figure 7E:
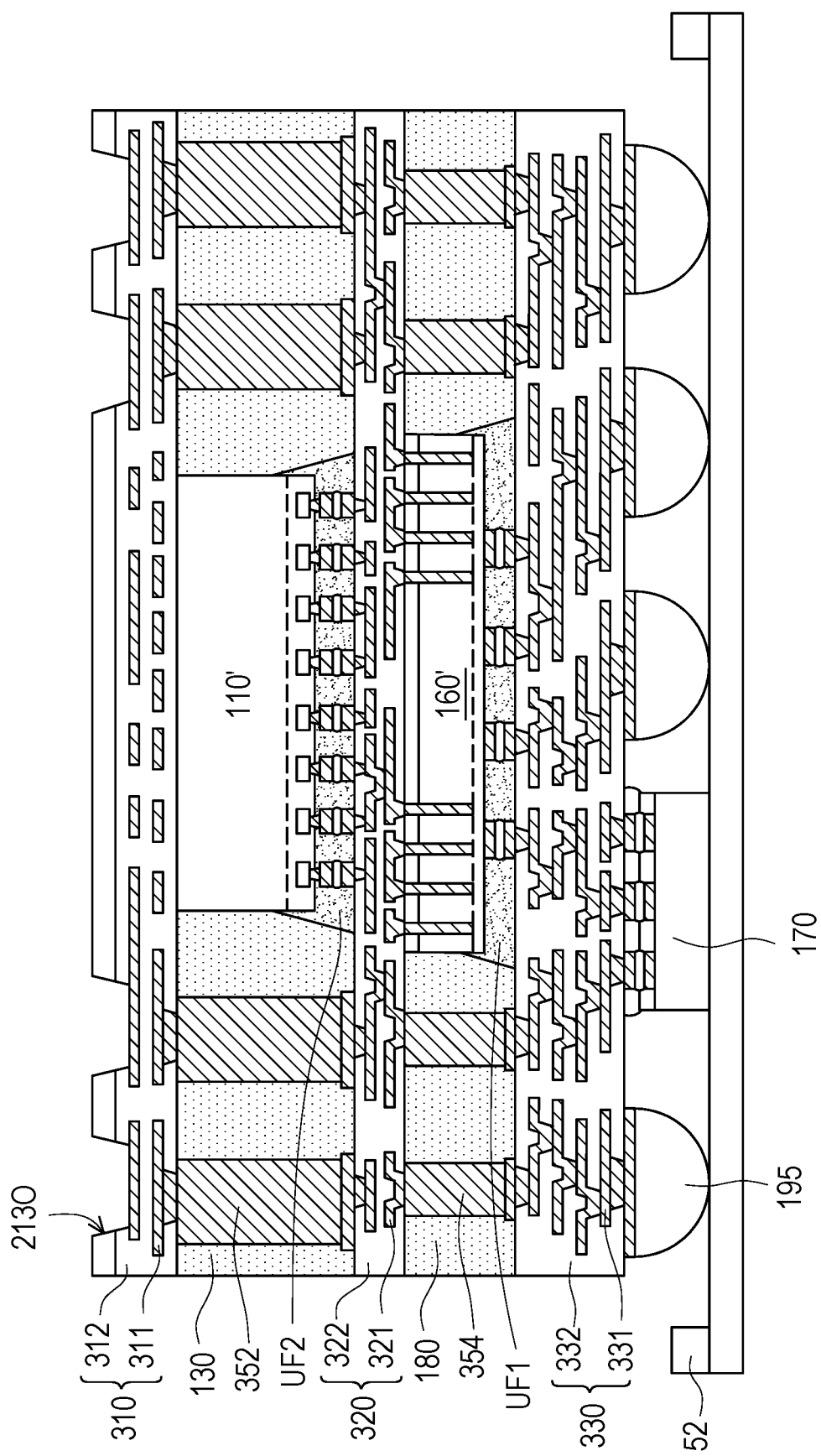

Referring to FIG. 7E and with reference to FIG. 7D, the structure of the FIG. 7D may be flipped upside-down, and the conductive terminals 195 and/or the electrical device 170 may be placed on the frame 52. The second temporary carrier 53 may then be removed by the method similar to the removal of the first temporary carrier 51 to accessibly reveal the backside redistribution structure 310. In some embodiments, the patterned dielectric layer 213 having the openings 2130 is formed on the outermost sublayer of the backside dielectric layer 312, and at least a portion of the outermost sublayer of the backside patterned conductive layer 311 may be accessibly revealed by the openings 2130 for further electrical connection. The material and the formation of the patterned dielectric layer 213 may be similar to the patterned dielectric layer 213 described in FIG. 2D.

Figure 7F:
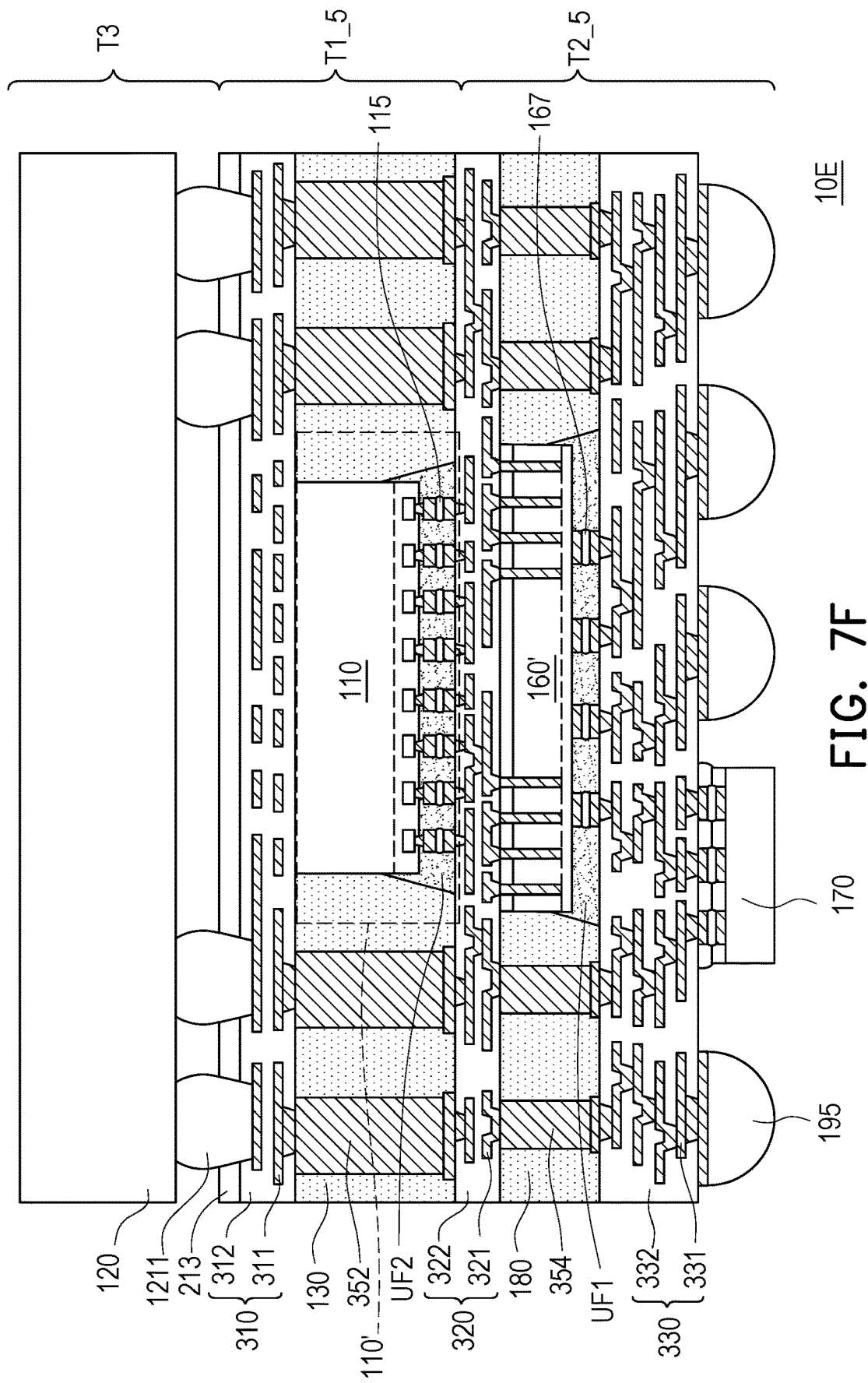

Referring to FIG. 7F and with reference to FIG. 7E, the second die 120, such as the memory package component, may be mounted on the backside redistribution structure 310 through the conductive joints 121l, e.g., solder joints. The mounting process of the second die 120 may be similar to the process described in FIG. 2E. In some embodiments, the aforementioned processes are performed at wafer level, and a singulation process is performed to cut through the patterned dielectric layer 213, the backside redistribution structure 310, the first insulating encapsulation 130, the middle redistribution structure 320, the second insulating encapsulation 180, and the front-side redistribution structure 330, so as to form a respective semiconductor package 10E.

With continued reference to FIG. 7F and also referring to FIG. 3E, the semiconductor package 10E is similar to the semiconductor package 10C described in FIG. 3E. The difference therebetween includes that the first and third dies (110' and 160') in the semiconductor package 10E are arranged in the face-to-back configuration, while the first and third dies in the semiconductor package 10C are arranged in the face-to-face configuration. For example, the first die 110' in the first tier T1_5 of the semiconductor package 10E is coupled to the middle redistribution structure 320 through the conductive joints 115. The backside of the third die 160' in the second tier T2_5 of the semiconductor package 10E faces the active surface of the first die 110', and the active surface of the third die 160' is coupled to the front-side redistribution structure 330 through the conductive joints 167.

The difference between the semiconductor package 10E and the semiconductor package 10C further includes that the conductive vias in the front-side, middle, and backside redistribution structures (330, 320, and 310) of the semiconductor package 10E are tapered toward a same direction from the first tier T1_5 toward the second tier T2_5, while the conductive vias in the front-side, middle, and backside redistribution structures (230, 220', and 210) of the semiconductor package 10C are tapered toward a same direction from the second tier T2_3 toward the first tier T1_3. The top view of the semiconductor package 10E may be similar to the top view described in FIG. 2F, and thus the detailed descriptions are not repeated for the sake of brevity.

Figure 8:
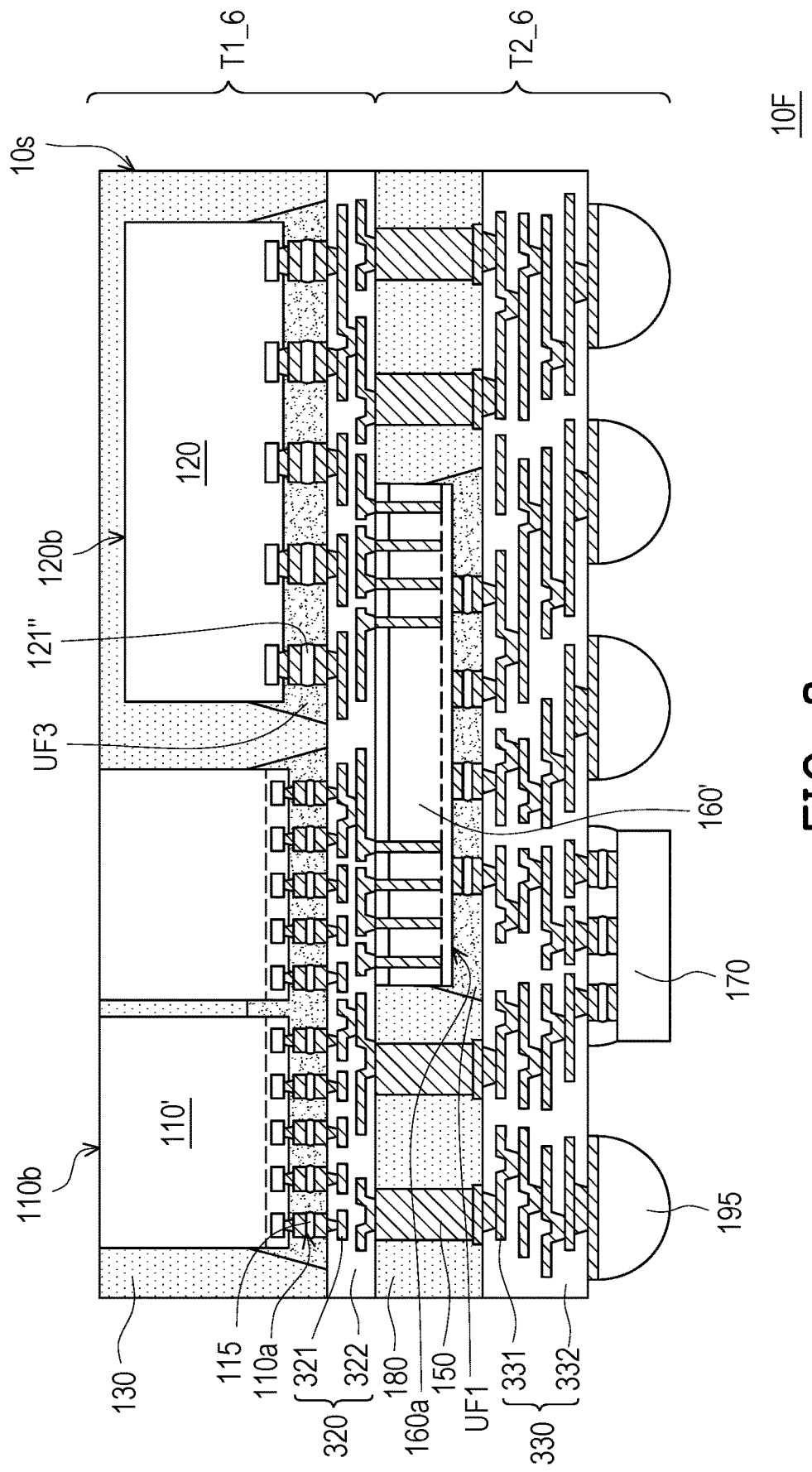
FIG. 8 is a schematic cross-sectional view illustrating a semiconductor package having a face-to-back configuration, in accordance with some embodiments.

FIG. 8 is a schematic cross-sectional view illustrating a semiconductor package having a face-to-back configuration, in accordance with some embodiments. The formation of the semiconductor package 10F having the face-to-back configuration illustrated in FIG. 8A may be similar to the forming methods of the semiconductor package 10E described in FIGS. 7A-7F, and thus the detailed descriptions are not repeated. The like components are denoted by like reference numerals in the embodiments.

Referring to FIG. 8A and with reference to FIG. 7F, the semiconductor package 10F may include the first tier T1_6 stacked on the second tier T2_6. The first tier T1_6 includes the first and second dies 110' and 120, the first insulating encapsulation 130, and the middle redistribution structure 320. For example, more than one first dies 110' are disposed side by side and coupled to the conductive pads of the middle redistribution structure 320 through the conductive joints 115 surrounded by the second underfill layer UF2. The second die 120 may be disposed next to one of the first dies 110', and the second die connectors 121 of the second die 120 may be coupled to the conductive pads of the middle redistribution structure 320. For example, the second die connectors 121' (as described in FIG. 1A) of the second die 120 are disposed on the conductive pads of the middle redistribution structure 320, and then a reflow process is performed on the second die connectors 121' to form the conductive joints 121" (e.g., solder joints) between the pillar portions of the second die connectors and the underlying conductive pads of the middle redistribution structure 320.

In some embodiments, a third underfill layer UF3 is formed in a gap between the second die 120 and the middle redistribution structure 320 to surround the second die connectors 121 and the underlying conductive pads of the middle redistribution structure 320. In some embodiments, the first insulating encapsulation 130 covers a portion of the sidewalls of the first dies 110' that is not covered by the second underfill layer UF2. In some embodiments, the back surface 120b of the second die 120 is lower than the back surface 110b of the respective first die 110', relative the middle redistribution structure 320. The first insulating encapsulation 130 may cover the sidewall and the back surface of the second die 120, where the thickness of the respective first die 110' is less than the thickness of the second die 120. Alternatively, the back surfaces 110b of the first dies 110' are substantially leveled with the back surface 120b of the second die 120.

The second tier T2_6 includes the third dies 160', the TIVs 150, the second insulating encapsulation 180, the front-side redistribution structure 330, the conductive terminals 195, and the electrical device 170. The third dies 160' and the first die 110' are arranged in the face-to-back configuration as the first die 110' and the third die 160' of the semiconductor package 10E described in FIG. 7F. In alternative embodiments, the first electrical device, such as the IPD, is embedded in the second insulating encapsulation 180 and the first underfill layer UF1 and is mounted onto the conductive pads of the front-side patterned conductive layer 331 of the front-side redistribution structure 330 through the conductive joints (e.g., solder joints). The third die 160' may be disposed right over the one of the first dies 110' and the second die 120. In some embodiments, the third die 160' are electrically coupled to the first die(s) 110' and the second die 120. In alternative embodiments, the third die 160' is disposed right over adjacent two of the first dies 110' and coupled to the two of the first dies 110'.

Figure 9A:
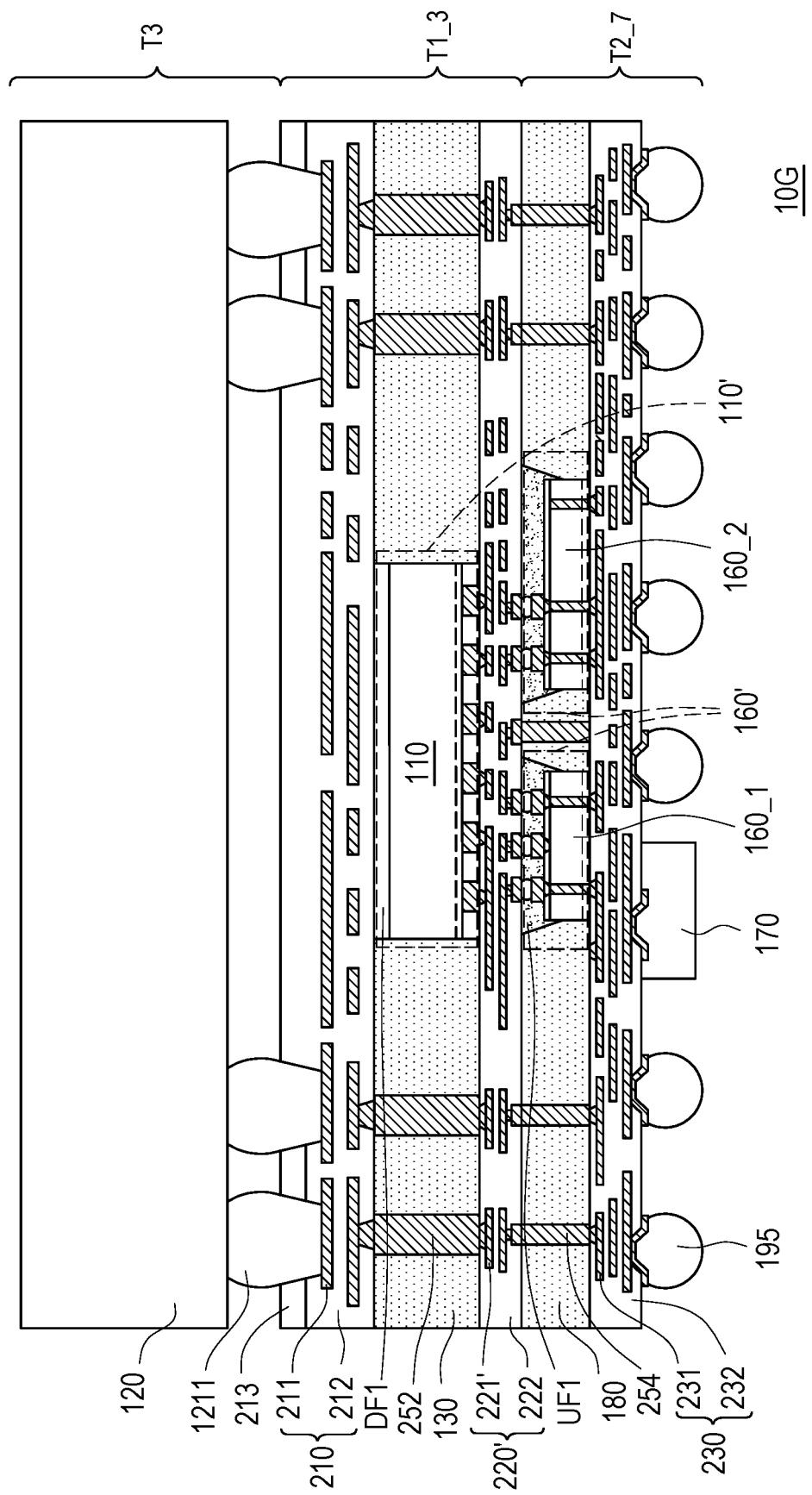
FIGS. 9A, 10A, and 11A are schematic cross-sectional views illustrating various semiconductor packages, in accordance with some embodiments.
Figure 9B:
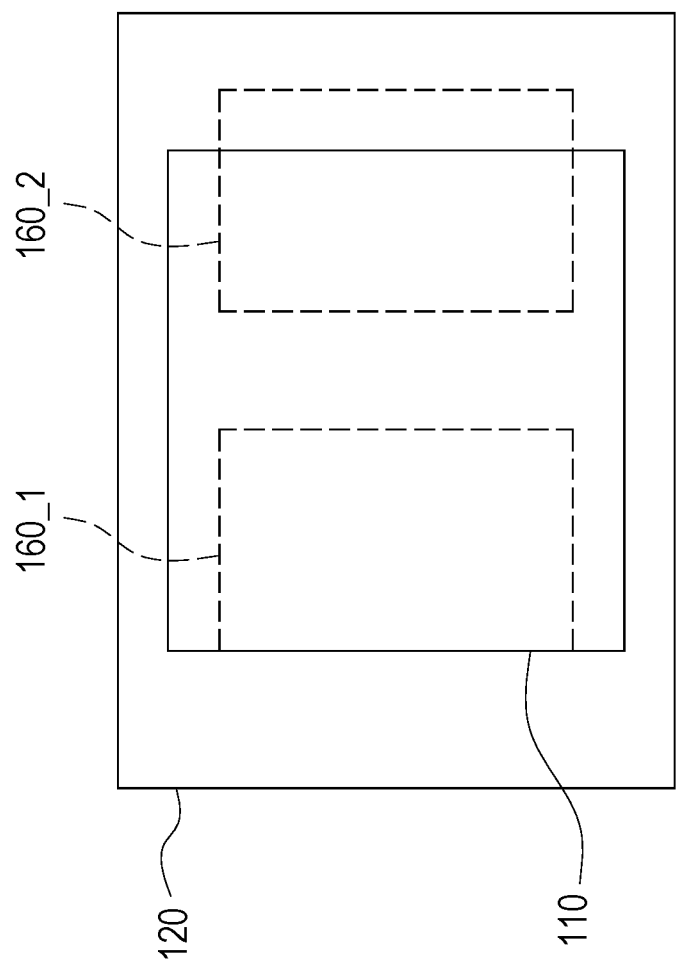
FIGS. 9B, 10B, and 11B are schematic top views illustrating configurations of various dies and electrical devices in the corresponding semiconductor packages of FIGS. 9A, 10A, and 11A, respectively, in accordance with some embodiments.
Figure 10A:
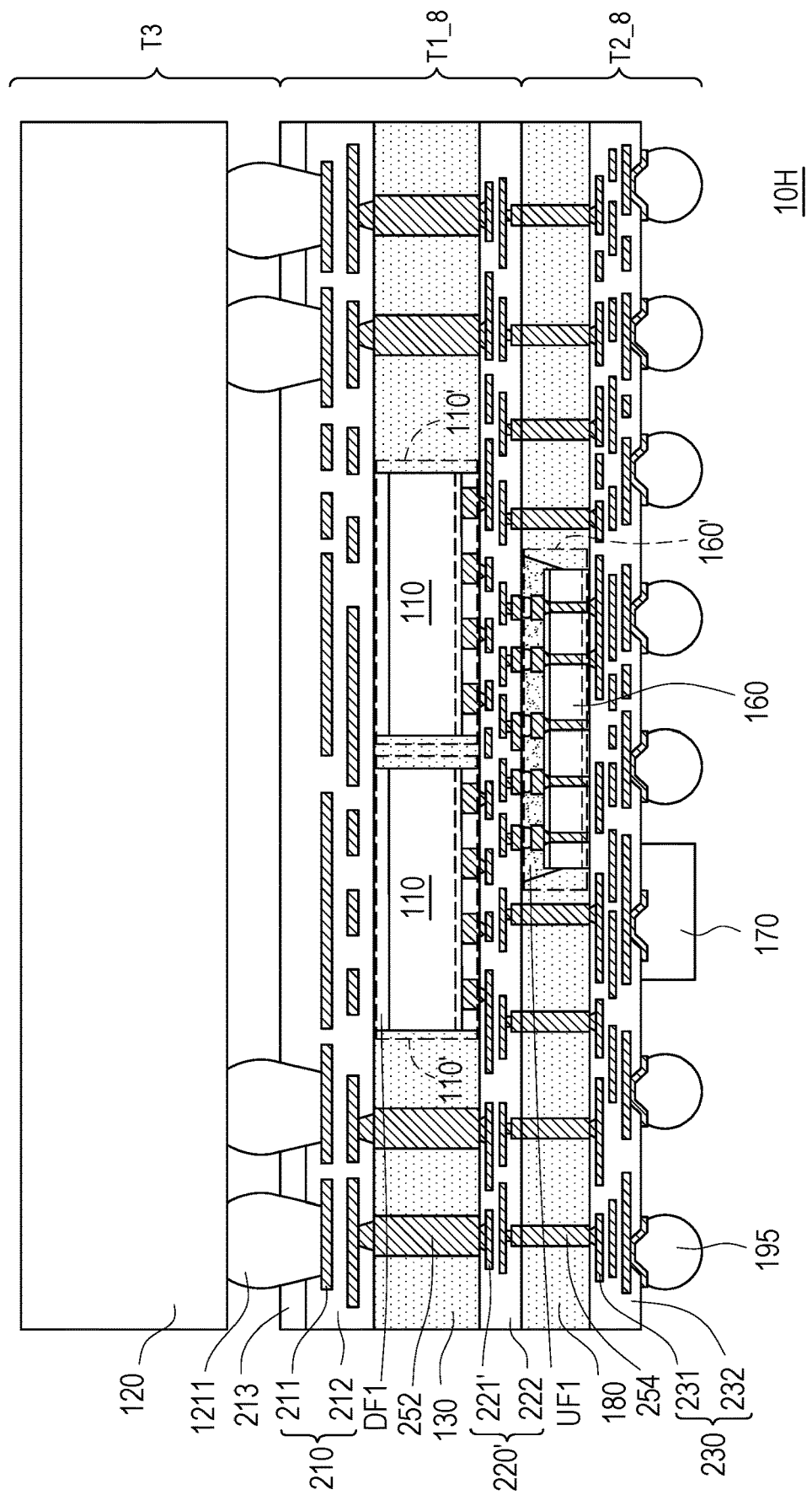
Figure 10B:
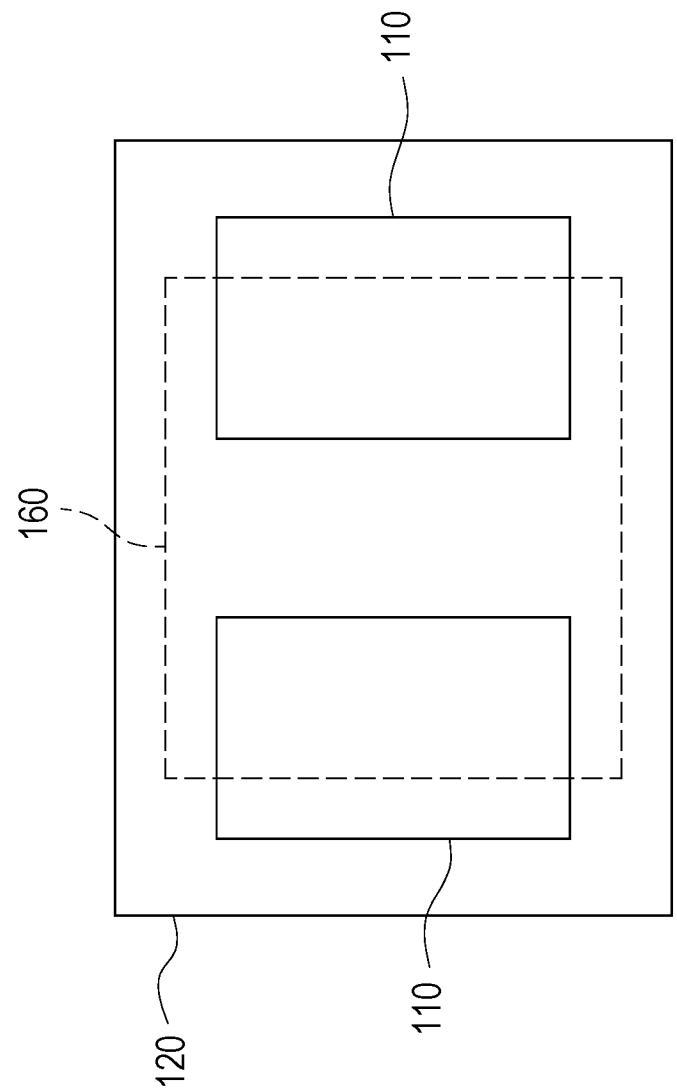
Figure 11A:
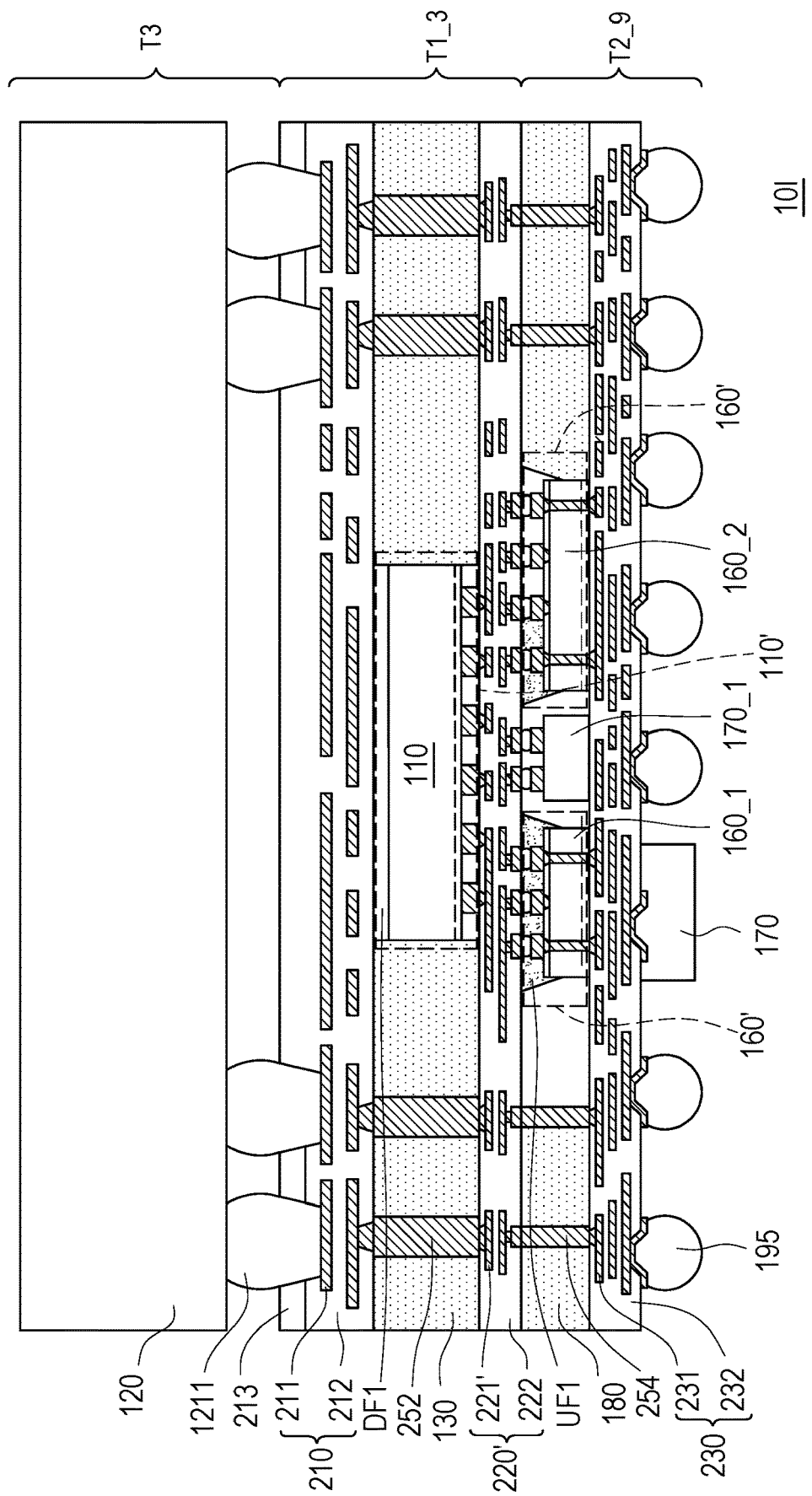
Figure 11B:
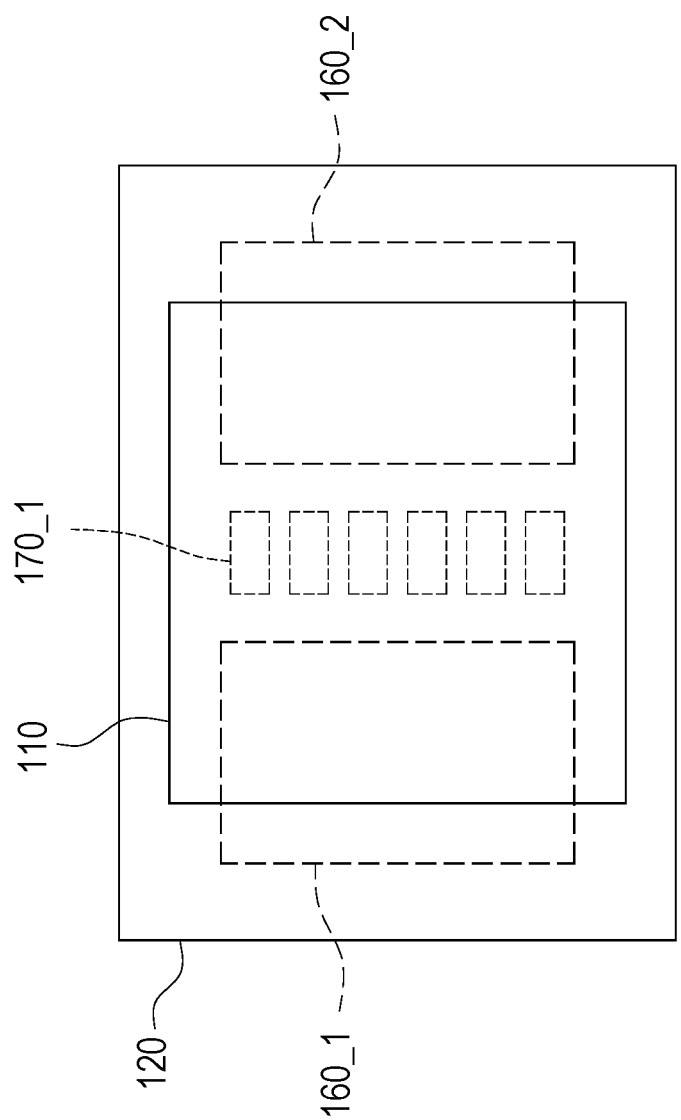

FIGS. 9A, 10A, and 11A are schematic cross-sectional views illustrating various semiconductor packages, and FIGS. 9B, 10B, and 11B are schematic top views illustrating configurations of various dies and electrical devices in the corresponding semiconductor packages of FIGS. 9A, 10A, and 11A, respectively, in accordance with some embodiments.

Referring to FIG. 9A, a semiconductor package 10G includes the first tier T1_3 stacked over the second tier T2_7, and the third tier T3 stacked over the first tier T1_3, where the first tier T1_3 and the third tier T3 are similar to the first and third tiers T1_3 and T3 of the semiconductor package 10B described in FIG. 2E. The second tier T2_7 includes the third dies (160_1 and 160_2) arranged side by side and separated from each other by the second insulating encapsulation 180 and the second TIVs 254, where the third dies (160_1 and 160_2) may be similar to the third dies (160_1 and 160_2) of the semiconductor package 10A described in FIG. 1F or the third die 160 of the semiconductor package 10B described in FIG. 2E. For example, the third dies (160_1 and 160_2) in the second tier T2_7 and the first die 110 in first tier T1_3 are arranged in the back-to-face configuration.

In some embodiments, the first die 110 in the first tier T1_3 and the third dies in the underlying second tier T2_7 are arranged in the face-to-face configuration, where the third dies may be replaced with the third dies (160_3 and 160_4) of the semiconductor package 10D described in FIG. 6D. In some embodiments, the first die in the first tier and the third dies in the underlying second tier are arranged in the face-to-back configuration, where the first and third dies may be respectively replaced with the first die 110' and the third dies 160' of the semiconductor package 10E described in FIG. 7F.

Referring to FIG. 9B and with reference to FIG. 9A, the lateral dimension of the first die 110 may be less than that of the second die 120. For example, in the top view, the orthographic projection area of the first die 120 is fully located within the orthographic projection area of the second die 120. The lateral dimension of the respective third die (160_1 or 160_2) may be less than that of the first die 110. In some embodiments, the orthographic projection area of one of the third dies (160_1 and 160_2) overlaps the orthographic projection area of the first die 110, and the orthographic projection area of the other one of the third dies (160_1 and 160_2) overlaps the first and second dies 110 and 120. The third dies (160_1 and 160_2) may have the same orthographic projection area or may have different orthographic projection areas. The boundary of the third die (160_1 and/or 160_2) may extend beyond the boundary of the first die 110, in the top view. It should be noted that the configuration shown in FIG. 9B is merely an example, and the number and the arrangement of these dies can be adjusted depending on product requirements.

Referring to FIG. 10A, a semiconductor package 10H includes the first tier T1_8 stacked over the second tier T2_8, and the third tier T3 stacked over the first tier T1_8. The first tier T1_8 includes more than one first dies 110 arranged side by side and separated from each other by the first insulating encapsulation 130. The second tier T2_8 includes the third die 160 surrounded by the second TIVs 254, where the third die 160 may be similar to the third die (160_1 or 160_2) of the semiconductor package 10A described in FIG. 1F or the third die 160 of the semiconductor package 10B described in FIG. 2E. In some embodiments, the third die 160 is a bridge die in electrical communication with the first dies 110. For example, the third die 160 in the second tier T2_8 and the first dies 110 in the first tier T1_8 are arranged in the back-to-face configuration. In some embodiments, the first dies 110 in the first tier T1_8 and the third die 160 in the underlying second tier T2_8 are arranged in the face-to-face configuration, where the third die may be replaced with the third die (160_3 or 160_4) of the semiconductor package 10D described in FIG. 6D. In some embodiments, the first dies in the first tier and the third die in the underlying second tier are arranged in the face-to-back configuration, where the first and third dies may be respectively replaced with the first die 110' and the third dies 160' of the semiconductor package 10E described in FIG. 7F.

Referring to FIG. 10B and with reference to FIG. 10A, the lateral dimension of each first die 110 may be less than that of the second die 120 and may also be less than that of the third die 160. The first dies 110 may have the same orthographic projection area or may have different orthographic projection areas. For example, in the top view, the orthographic projection area of the third die 160 is fully located within the orthographic projection area of the second die 120. In some embodiments, the orthographic projection area of each first die 110 partially overlaps the orthographic projection area of the third die 160. The boundary of the respective first die 110 may extend beyond the boundary of the third die 160, in the top view. It should be noted that the configuration shown in FIG. 10B is merely an example, and the number and the arrangement of these dies can be adjusted depending on product requirements.

Referring to FIG. 11A and with reference to FIG. 9A, a semiconductor package 10I includes the first tier T1_3 stacked over the second tier T2_9, and the third tier T3 stacked over the first tier T1_3, where the first tier T1_3 is the same as the first tier T1_3 of the semiconductor package 10G in FIG. 9A, and the third dies (160_1 and 160_2) in the second tier T2_9 and the first die 110 in the first tier T1_3 are arranged in the back-to-face configuration. The second tier T2_9 is similar to the second tier T2_7, except that the second tier T2_9 includes at least one first electrical device 170_1 interposed between the third dies (160_1 and 160_2). In some embodiments, first die 110 in the first tier T1_3 and the third dies in the second tier T2_9 are arranged in the face-to-face configuration, where the third dies may be replaced with the third die (160_3 or 160_4) of the semiconductor package 10D described in FIG. 6D. In some embodiments, the first dies in the first tier and the third die in the underlying second tier are arranged in the face-to-back configuration, where the first and third dies may be respectively replaced with the first die 110' and the third dies 160' of the semiconductor package 10E described in FIG. 7F.

Referring to FIG. 11B and with reference to FIG. 11A, in the top view, a plurality of first electrical devices 170_1 are arranged in a column between the third dies (160_1 and 160_2). It should be noted that the number and the arrangement of the first electrical devices 170_1 are merely an example and construe no limitation in the disclosure. The lateral dimension of each first die 110 may be less than that of the second die 120. For example, in the top view, the orthographic projection area of the first die 120 is fully located within the orthographic projection area of the second die 120. The lateral dimension of the respective third die (160_1 or 160_2) may be less than that of the first die 110. For example, the orthographic projection area of the respective third die (160_1 and 160_2) partially overlaps the orthographic projection area of the first die 110, and the column of the first electrical devices 170_1 is fully located within the orthographic projection area of the first die 110. The boundary of the third die (160_1 and/or 160_2) may extend beyond the boundary of the first die 110, in the top view. It should be noted that the configuration shown in FIG. 11B is merely an example, and the number and the arrangement of these dies and electrical devices can be adjusted depending on product requirements.

According to some embodiments, a semiconductor package includes a first tier and a second tier underlying the first tier. The first tier includes a first die and a second die disposed side by side and separated from each other by a first insulating encapsulation, and a first redistribution structure. A surface of the first insulating encapsulation is substantially leveled with surfaces of first die connectors of the first die and truncated spherical surfaces of second die connectors of the second die, and the first redistribution structure underlies the surfaces of the first insulating encapsulation and the first die connectors of the first die and the truncated spherical surfaces of the second die connectors of the second die. The second tier includes third dies disposed below the first redistribution structure, and TIVs. The third dies are electrically coupled to the first die through the first redistribution structure and laterally covered by a second insulating encapsulation. The TIVs penetrate through the second insulating encapsulation and are electrically coupled to the second die through the first redistribution structure.

According to some alternative embodiments, a semiconductor package includes a first tier and a second tier underlying the first tier. The first tier includes at least one first die including first die connectors distributed on a first active surface, a second die laterally separated from the first die by a first insulating encapsulation, and a first redistribution structure underlying the at least one first die, the second die, and the first insulating encapsulation. The second die includes second die connectors distributed on a second active surface, and the second die is coupled to the first redistribution structure through first solder joints. The second tier includes at least one third die disposed below the first redistribution structure and laterally covered by a second insulating encapsulation, TIVs penetrating through the second insulating encapsulation and electrically coupled to the second die through the first redistribution structure, and a second redistribution structure underlying the third die, the second insulating encapsulation, and the TIVs. The third die includes TSVs penetrating through a semiconductor substrate and electrically coupled to the first die, and third die connectors of the third die are coupled to the first redistribution structure or the second redistribution structure through second solder joints.

According to some alternative embodiments, a semiconductor package includes a first tier, a second tier stacked upon the first tier, and a third tier underlying the first tier. The first tier includes at least one first die including an active surface and a back surface opposite to each other, a first insulating encapsulation laterally covering the at least one first die, a first TIV penetrating through the first insulating encapsulation, a backside redistribution structure overlying the first insulating encapsulation, the first TIV, and the back surface of the at least one first die, and a middle redistribution structure underlying the first insulating encapsulation, the first TIV, and the active surface of the at least one first die. The second tier is a second die electrically coupled to the at least one first die through the backside redistribution structure, the first TIV, and the middle redistribution structure. The third die includes at least one third die including an active surface and a back surface opposite to each other, a second insulating encapsulation laterally covering the at least one third die, a second TIV penetrating through the second insulating encapsulation, and a front-side redistribution structure underlying the second insulating encapsulation, the second TIV, and the active surface of the at least one third die. The middle redistribution structure is interposed between the back surface of the at least one third die and the active surface of the at least one first die and is electrically coupled to the at least one first die and the at least one third die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first tier comprising:
        a first die and a second die disposed side by side and separated from each other by a first insulating encapsulation, and a surface of the first insulating encapsulation being substantially leveled with surfaces of first die connectors of the first die and truncated spherical surfaces of second die connectors of the second die; and
        a first redistribution structure underlying the surfaces of the first insulating encapsulation and the first die connectors of the first die and the truncated spherical surfaces of the second die connectors of the second die, the first redistribution structure comprising a dielectric layer and a conductive via in the dielectric layer, wherein the conductive via is in contact with a first portion of the truncated spherical surface of one of the second die connectors of the second die, the dielectric layer is in contact with a second portion of the truncated spherical surface of the one of the second die connectors of the second die, and the second portion surrounds the first portion; and
    a second tier underlying the first tier and comprising:
        third dies disposed below the first redistribution structure, electrically coupled to the first die through the first redistribution structure, and laterally covered by a second insulating encapsulation; and
        through insulating vias (TIVs) penetrating through the second insulating encapsulation and electrically coupled to the second die through the first redistribution structure.

2. The semiconductor package of claim 1, wherein each of the third die comprises:
    a device layer underlying a front surface of a semiconductor substrate, wherein a back surface of the semiconductor substrate opposite to the front surface faces the surfaces of the first die connectors of the first die, and the back surface of the semiconductor substrate is distal from the surfaces of the first die connectors; and
    a through substrate via (TSV) penetrating through the semiconductor substrate and electrically coupled to the device layer.

3. The semiconductor package of claim 1, wherein the conductive via of the first redistribution structure is tapered toward the first portion of the truncated spherical surface of one of the second die connectors of the second die.

4. The semiconductor package of claim 1, further comprising:
    an integrated passive device laterally interposed between adjacent of the third dies and disposed right below the first die, and connectors of the integrated passive device being coupled to the first redistribution structure through solder joints.

5. The semiconductor package of claim 1, further comprising:

a thermal conductive film disposed on a back surface of the first die opposite to the surfaces of the first die connectors, and an opposing surface of the first insulating encapsulation being substantially leveled with a surface of the thermal conductive film and a back surface of the second die.

6. The semiconductor package of claim 1, further comprising:
an underfill layer disposed in a gap between the first redistribution structure and the third dies, the underfill layer being tapered from the first redistribution structure toward backsides of the third dies in a cross-sectional view.

7. The semiconductor package of claim 1, further comprising:
a second redistribution structure underlying the third dies, the TIVs, and the second insulating encapsulation, wherein first conductive vias of a first patterned conductive layer of the first redistribution structure and second conductive vias of a second patterned conductive layer of the second redistribution structure are tapered in a same direction, and the second patterned conductive layer being connected to a TSV of the third dies.

8. A semiconductor package, comprising:
a first tier comprising:
at least one first die comprising first die connectors distributed on a first active surface;
a second die laterally separated from the first die by a first insulating encapsulation, and the second die comprising second die connectors distributed on a second active surface, wherein one of the second die connectors comprises a pillar and a first solder joint comprising a first end connected to the pillar and a second end opposite to the first end; and
a first redistribution structure underlying the at least one first die, the second die, and the first insulating encapsulation, the first redistribution structure comprising a dielectric layer and a conductive via laterally covered by the dielectric layer and connected to the second end of the first solder joint, wherein a first contact area of the first end of the first solder joint connected to the pillar is greater than a second contact area of the second end of the first solder joint connected to the conductive via;
a second tier underlying the first tier and comprising:
at least one third die disposed below the first redistribution structure, laterally covered by a second insulating encapsulation, and the at least one third die comprising through substrate vias (TSVs) penetrating through a semiconductor substrate and electrically coupled to the at least one first die;
through insulating vias (TIVs) penetrating through the second insulating encapsulation and electrically coupled to the second die through the first redistribution structure; and
a second redistribution structure underlying the at least one third die, the second insulating encapsulation, and the TIVs, wherein third die connectors of the at least one third die are coupled to the first redistribution structure or the second redistribution structure through second solder joints.

9. The semiconductor package of claim 8, wherein:
the first die connectors are laterally covered by a protection layer of the at least one first die, and the protection layer is laterally covered by the first insulating encapsulation.

10. The semiconductor package of claim 8, wherein:
a first interface of the first die connectors and the first redistribution structure is free of solder materials,
a second interface of the second die connectors and the first redistribution structure comprises solder materials, and
the first interface and the second interface are substantially coplanar.

11. The semiconductor package of claim 8, wherein the second tier further comprises:
an underfill layer disposed in a gap between the first redistribution structure and the at least one third die, and the underfill layer tapering from the first redistribution structure toward a backside of the at least one third die.

12. The semiconductor package of claim 8, wherein the at least one third die comprises a plurality of third dies, and the second tier further comprises:
an integrated passive device laterally interposed between two adjacent of the third dies, wherein the integrated passive device is coupled to the first redistribution structure through third solder joints, and a back surface of the integrated passive device faces the second redistribution structure.

13. The semiconductor package of claim 8, wherein:
each of the second die connectors comprises a pillar portion and a cap portion connecting the pillar portion to the first redistribution structure,
the pillar portion and the cap portion are made of different materials and laterally covered by the first insulating encapsulation, and
the cap portion has a curved profile in a cross-sectional view.

14. A semiconductor package, comprising:
a first tier comprising:
a first die and a second die;
a first insulating encapsulation laterally covering each of the first die and the second die
a first redistribution structure underlying the first insulating encapsulation, the first die, and the second die, the first redistribution structure comprising a dielectric layer and a conductive via in the dielectric layer, wherein:
a first interface of the first redistribution structure and a first die connector of the first die is free of solder materials,
a second interface of the first redistribution structure and a second die connector of the second die comprises a first portion and a second portion connected to the first portion, the first portion is an interface of a solder material and the conductive via, and the second portion is an interface of the solder material and the dielectric layer, and
the first interface, the second interface, and a third interface of the first insulating encapsulation and the first redistribution structure are substantially coplanar; and
a second tier underlying the first tier and comprising:
a third die electrically coupled to the first die and the second die through the first redistribution structure; and
a second insulating encapsulation laterally covering the third die.

15. The semiconductor package of claim 14, wherein:
the second die connector comprises a pillar portion and a cap portion connecting the pillar portion to the first redistribution structure, the pillar portion and the cap portion are in lateral and physical contact with the first insulating encapsulation, and the cap portion laterally protrudes toward the first insulating encapsulation, wherein the cap portion is the solder material.

16. The semiconductor package of claim 14, wherein a first vertical distance between the first interface and a back surface of the first die is less than a second vertical distance between the second interface and a back surface of the second die.

17. The semiconductor package of claim 14, wherein the conductive via of the first redistribution structure is tapered toward the second interface.

18. The semiconductor package of claim 14, wherein the second tier further comprises a second redistribution structure underlying the third die, and both of a first conductive via of the first redistribution structure and a second conductive via of the second redistribution structure are tapered in a direction from an active surface of the first die toward a back surface of the first die, wherein the first die connector is disposed on the active surface.

19. The semiconductor package of claim 14, wherein the first die comprises a protective layer laterally covering the first die connector, and the first insulating encapsulation is laterally spaced apart from the first die connector by the protective layer.

20. The semiconductor package of claim 14, wherein the second die comprises a first surface and a second surface, the second die connector is protruded from the first surface, and a portion of the first insulating encapsulation extends to be disposed on the first surface and is vertically interposed between the first redistribution structure and the first surface of the second die.

\* \* \* \* \*